(12) United States Patent
Garnache et al.

(10) Patent No.: US 6,658,034 B2
(45) Date of Patent: Dec. 2, 2003

(54) SURFACE-EMITTING SEMICONDUCTOR LASER

(75) Inventors: Arnaud Garnache, Southampton (GB); Alexandre Katchanov, Sunnyvale, CA (US); Frederick Stoeckel, Saint Martin d'Héres Cedex (FR)

(73) Assignee: Picarro, Inc., Sunnyvale, CA (US)

( * ) Notice: Subject to any disclaimer, the term of this patent is extended or adjusted under 35 U.S.C. 154(b) by 317 days.

(21) Appl. No.: 09/738,277

(22) Filed: Dec. 13, 2000

(65) Prior Publication Data

US 2002/0071463 A1 Jun. 13, 2002

(51) Int. Cl.[7] .................................................. H01S 5/10

(52) U.S. Cl. ........................................................ 372/45

(58) Field of Search ............................................ 372/45

(56) References Cited

U.S. PATENT DOCUMENTS

| | | | | |
|---|---|---|---|---|
| 5,058,124 A | * | 10/1991 | Cameron et al. | 372/107 |
| 5,237,577 A | * | 8/1993 | Keller et al. | 372/11 |
| 6,154,471 A | * | 11/2000 | Jin et al. | 372/20 |
| 6,263,002 B1 | * | 7/2001 | Hsu et al. | 372/6 |
| 6,393,035 B1 | * | 5/2002 | Weingarten et al. | 372/18 |

* cited by examiner

Primary Examiner—Paul Ip
Assistant Examiner—Jeffrey Zahn
(74) Attorney, Agent, or Firm—Lumen Intellectual Property Services, Inc.

(57) ABSTRACT

A laser suitable for intra-cavity laser absorption spectroscopy and for telecommunication system comprises a Bragg mirror, a multiple quantum well active region and an anti-reflective coating together with a second mirror spaced from the coating to define an external cavity, the free spectral range of the sub-cavity defined by the coating and the active region being less than two times the bandwidth of the coating and the bandwidth of the Bragg mirror being at least as great as the free spectral range of the sub-cavity.

5 Claims, 15 Drawing Sheets

Field distribution and Reflectivity of the complete structure (without absorption)

Reflectivity of the AR "alone" (InP substrate+5x$\lambda$/4 InP+7x$\lambda$/4 dielectric)

SURFACE-EMITTING SEMICONDUCTOR LASER

FIELD OF THE INVENTION

The present invention relates to a vertical external cavity surface emitting lasers ("VECSELs") excited by optical or electrical pumping. More particularly, the present invention relates to VECSELs which are tunable, which may be made stable at one of a selectable plurality of modes, and which are more readily fabricated and with less complexity than prior approaches.

BACKGROUND OF THE INVENTION

Practical semiconductors lasers generally follow two basic architectures. The first laser type has an in-plane cavity, and the second laser type has a vertical cavity, a so-called vertical-cavity surface-emitting laser or "VCSEL". If the optical resonance cavity is formed externally of the semiconductor structure, the laser is known as a vertical external cavity surface-emitting laser or "VESCEL".

One known drawback of in-plane diode lasers, and most particularly the Fabry-Perot type, is that it has a tendency to mode-hop, i.e. to hop unpredictably to a different mode (wavelength) in spite of a constant pumping current. As the current is increased, there are wavelengths at which the mode hopping becomes uncontrollable. Moreover, diode lasers may show hysteresis, in that mode hopping may occur at different wavelengths during control current increases than at control current decreases. Another issue with in-plane diode lasers is the transverse optical beam profile is typically elliptical rather than circular, and has high divergence, increasing the complexity of coupling the laser energy into an optical fiber. Precision gluing of tiny aspheric lenses at the laser-fiber interface is often required.

Furthermore, such lasers only have about 30 to 35 dB of side mode suppression. If the side modes are not well enough controlled, the laser may excite two or three adjacent communications channels, resulting in unwanted interference.

VCSELs include semiconductor structures which have multiple layers epitaxially grown upon a semiconductor wafer or substrate, typically gallium arsenide. The layers comprise Bragg or dielectric-layer mirrors which sandwich layers comprising quantum well active regions. Within the VCSEL, photons emitted by the quantum wells are reflected between the mirrors and are then emitted vertically from the wafer surface. VCSEL lasers typically have a circular dot geometry with lateral dimensions of a few microns. The emitting aperture of a few microns facilitates direct-coupling to optical fibers or other simple optics, since a narrow aperture typically supports only a single lateral mode ($TEM_{00}$) of the resulting optical waveguide, but is sufficiently wide to provide an emerging optical beam with a relatively small diffraction angle. The typical power does not exceed 3 mW in $TEM_{00}$. Recently, a 1.3 micron VCSEL was said to be developed by Sandia National Laboratories in conjunction with Cielo Communications, Inc. According to a news report, "This new VCSEL is made mostly from stacks of layers of semiconductor materials common in shorter wavelength lasers . . . aluminium gallium arsenide and gallium arsenide. The Sandia team added to this structure a small amount of a new material, indium gallium arsenide nitride (InGaAsN), which was initially developed by Hitachi of Japan in the mid 1990s. The InGaAsN causes the VCSEL's operating wavelength to fall into a range that makes it useable in high-speed Internet connections." ("First ever 1.3 micron VCSEL on GaAs", Optics.Org Industry News, posted Jun. 16, 2000.) One of the characteristics of VCSELs is that the laser cavity is formed entirely within the semiconductor structure.

As mentioned above, if a cavity is formed which is external to the semiconductor structure having the quantum well active region, the laser is known as a VECSEL. One example of an optically-pumped VECSEL is described in IEEE Photonics Technology Letters Vol. 9, No. 8 pp 1063–1066 and in WO 00/10234, the disclosures thereof being incorporated herein by reference. The disclosed VECSEL includes an epitaxially-grown semiconductor structure or chip having a multiple-layer mirror structure integrated with a multiple-layer quantum-well structure which provides a gain medium, and an external mirror forming a resonant cavity with the integrated semiconductor multi-layer mirror. Optical pumping radiation is directed at the quantum-well and pump-absorbing layers. The quantum-well layers release photons in response to the pumping energy, and the external cavity is dimensioned to result in laser energy output at approximately 976 nm in response to pumping energy at approximately 808 nm. Because this VECSEL operates in the visible light spectrum, the active gain medium is made to be aluminum-free, since aluminum ions tend to diffuse in visible light lasers. Accordingly, the quantum-well and pump-radiation absorbing layers are aluminum-free layers of alloys of gallium arsenide and indium gallium arsenide phosphide (GaAs/InGaAsP).

One approach for tuning a VECSEL is described in a paper by D. Vakhshoori, P. Tayebati, Chih-Cheng Lu, M. Azimi, P. Wang, Jiang-Huai Zhou and E. Canoglu entitled, "2 mW CW single mode operation of a tunable 1550 nm vertical cavity surface emitting laser with 50 nm tuning range", published in Electronics Letters, Vol. 35, No. 11, May 27, 1999, pp. 1–2, the disclosure thereof being incorporated herein by reference. The VECSEL structure described in this note comprises an indium phosphide substrate carrying an epitaxially-grown 1.55_m multiple quantum well system. A via is formed through the bottom of the substrate and a thermally conductive multilayer mirror is deposited into the via to form the bottom mirror of the cavity. A support post structure and a top membrane having a multilayer top mirror structure is formed on top of the active region. The radius of curvature of approximately 300 μm of the top mirror results in a stable optical resonator cavity as well as a pumping-exit window. To achieve tuning, a voltage is applied between the top membrane and the bottom mirror. The electrostatic force generated will pull the top mirror toward the bottom mirror, reducing the cavity length and also reducing the laser wavelength. With a 980 nm laser pump at 40 mW, a $TEM_{00}$ single mode output at approximately 2 mW is achieved by the VECSEL. A tuning voltage from 0 volts to 40 volts changes the VECSEL's output wavelength from 1564 to 1514 nm. One drawback of the VECSEL described in this note is the fabrication complexity. Another drawback is that the VECSEL must be continuously regulated by a voltage control loop in order to maintain the VECSEL at the desired wavelength.

VECSELs may have as a gain structure a few microns thick multiple quantum well active region sandwiched between a bottom Bragg minor grown on a semiconductor substrate, and an epitaxially grown antireflection coating or dielectric coating. An external high reflectivity dielectric concave minor is then added to form an external optical cavity. Co-inventors Garnache, Kachanov and Stockel of the present invention have previously reported in a paper entitled "High-sensitivity intracavity laser absorption spectroscopy with vertical-external-cavity surface-emitting semiconductor lasers", Optics Letters, Vol. 24, No. 12, Jun. 15, 1999, pp. 826–828 (the disclosure of which is incorporated herein by reference),that an optically pumped multiple-quantum-well ("MQW") VECSEL is an excellent candidate for use in high sensitivity intracavity laser absorption spectroscopy ("ICLAS"). In the ICLAS method an absorbent analyte is placed inside an external cavity of a broadband laser with homogeneously broadened gain. In the setup reported in this paper, a VECSEL was grown by molecular beam epitaxy on a 0.5 mm gallium arsenide substrate. The bottom stack was a standard Bragg mirror comprising 30.5 pairs of aluminum arsenide/aluminum gallium arsenide quarter-wave layers having a measured reflectance of 99.96 percent at a design wavelength of 1030 nm. The MQW active region comprised two sets of three (2×3) strained 8 nm indium gallium arsenide quantum wells separated by 10 nm gallium arsenide baffler layers. Each set was placed at the maximum of the intra-cavity standing wave. A quarter-wave layer of aluminium arsenide was grown on top of the active region followed by an aluminium gallium arsenide ($Al_{0.07}Ga_{0.93}As$) half-wave layer. This layer, which has a higher bandgap energy than the active zone material GaAs is needed to prevent carriers from diffusing to the semiconductor surface and to have an aluminum-poor surface to avoid surface deterioration. In this arrangement the air interface/Bragg minor sub-cavity formed by the semiconductor structure operates at anti-resonance. Reference may also be made to IEE Photonics Technology Letters Vol. 8 No. 3 March 1996 pp313–315, Sandusky and Brueck (the disclosure of which is incorporated herein by reference). That paper discloses a VECSEL having an active region between a standard high reflector and an anti-reflection (AR) layer. In spite of the AR layer, and because the active region is of great length (it includes thirty quantum wells), the subcavity operates at resonance and the laser therefore suffers from problems similar to those referred to above.

SUMMARY OF THE INVENTION

In one aspect of the present invention, unsolved problems can be overcome by providing a semiconductor structure forming a sub-cavity operating at anti-resonance to achieve a broadband gain medium and/or a homogeneously broadened active gain medium. We have achieved this desired antiresonance by matching the behaviour of an antireflective layer with the behaviour of the whole of the sub-cavity, in particular by correlating the bandwidth of the antireflective coating with the free-spectral range of the sub-cavity. As a result of this correlation, the antireflectant layer may be regarded as an anti-resonance layer.

We have now designed a new combination of high reflectance mirror (such as a Bragg mirror), active region (which may contain one or more quantum wells) and an anti-reflection component (AR) (generally a coating, and may have the form of a Bragg stack). In general, this combination may be regarded as a gain mirror. This new design may increase the spectral bandwidth of the coupling between the active region and the external laser cavity by using an AR coating that is narrow-band and by designing the sub-cavity of the gain mirror so that it operates at anti-resonance. It preferably uses an active region that is thinner than relevant prior-art designs.

The narrow-band AR coating is preferably a Bragg stack comprising a multiplicity of dielectric layers. The reflection at the gain mirror interface with the air (i.e. at the interface of AR coating with the air in the external cavity) is significantly larger than the reflection at interfaces between the layers in the active region so the space between the surface of the AR coating at the air interface and the highly reflective Bragg stack at the opposite end of the gain mirror acts as a sub-cavity. The sub-cavity works at anti-resonance at the design wavelength $\lambda$ (see below), and hence the sub-cavity length should be an odd multiple of $\lambda/4$. However, the narrow-band response of the AR stack results in a resonance condition being set up at certain wavelengths either side of $\lambda$, namely where the sub-cavity length is an even multiple of that other wavelength divided by four. Since the effective gain is proportional to the product of the material gain produced by the quantum wells in the active region and the modulus squared of the electric field $[E]^2$, the net effect of the AR stack is to increase the effective gain bandwidth of the gain mirror. The AR stack bandwidth is designed to match approximately the free spectral range (FSR) (see below) between the two sub-cavity modes i.e. the mode associated with anti-resonance and the mode associated with resonance. As a result the gain mirror has a filter profile with a shape like a top-hat and it is considerably broader than the single-peak curve characteristic of the intrinsic gain bandwidth.

This new design for the gain mirror has the advantage that it increases the gain bandwidth and hence improves coupling between the sub-cavity and the external cavity in the region of the spectrum close to the design wavelength. The multilayer structure of the AR coating is specially designed to provide such coupling between the sub-cavity and the external cavity at wavelengths close to the design wavelength.

One object of the present invention is to realise a sub-cavity operating an anti-resonance and an antireflection coating.

A further object of the present invention is to realise an optically or electrically pumped semiconductor laser having a broadband gain medium and/or a homogeneously broadened gain medium with spectral narrowing as a function of operating time.

Another object of the present invention is to provide a VECSEL laser having a sub-cavity operating at anti-resonance which may readily be adapted and used in diverse applications including ICLAS, cavity ring down spectroscopy ("CRDS") and optical fiber-based telecommunications systems and ultra-short pulse operation by modelocking.

Another object of the present invention is to realise a VECSEL having a semiconductor structure formed by molecular beam epitaxy in a manner obviating the need for a semiconductor substrate, thereby overcoming limitations and drawbacks of prior approaches in which a substrate contributed to the presence of a Fabry-Perot etalon or other unwanted optical element.

Another object of the present invention is to realise a laser operating reliably and solely at wavelengths employed in standardized wavelength division multiplexing (WDM) used in optical fiber telecommunications networks. Thus, the laser is able to mode-hop precisely from channel to channel with an accuracy better than ten percent of the channel spacing.

One more object of the present invention is to realise an optically pumped or electrically pumped MQW VECSEL having sidemode suppression well in excess of 50 dB.

Thus, the invention provides a laser comprising;
(1) the following layers in the following order
   (a) a mirror such as a Bragg mirror in particular a hybrid metal/Bragg mirror;
   (b) an active region providing optical gain; and
   (c) an anti-reflection coating which together with the active region defines a sub-cavity; and (2) a second mirror spaced from coating (c) to define an external cavity;

the layers (1) being such that the free spectral range of the sub-cavity is less than 2 times particularly less than 1.5 times especially less than one times the bandwidth of the coating (c);

and the bandwidth of the mirror (a) is at least at great, preferably at least 1.5 time as great, as the free spectral range of the sub-cavity.

The active region (b) preferably has at least one, more preferably from one to twenty quantum wells. For many purposes, the preferred number will be from two to ten, especially from four to ten quantum wells. The quantum wells are desirably located at peaks in an e-field distribution at a design wavelength of the laser. The term "design wavelength" will be well-understood by the reader of this specification, and it is in any case defined below.

The mirror (a) and the active region (b) preferably together form a gain mirror. The gain will usually be positive, but may be negative and in that case the various components that form part of the laser defined herein may be used as a filter. The gain mirror and the external cavity preferably have a filter function such that when the laser is tuned over 1% (preferably over 5% especially over 10%) of its center wavelength of the filter function, then a threshold value of the laser remains below 1000% of its minimum value, preferably below 500%, especially below 200%.

Alternatively or additionally, when the laser is tuned over 1% (preferably over 5% especially over 10%) of its center wavelength of the filter function then a conversion efficiency of the laser remains above 10% of its maximum value, preferably above 25%, especially above 50%.

Region (b) will in general be capable of optical gain at some wavelength $\lambda$ and we prefer that region (b) has an optical path length of 20 $\lambda/2$ or less, more preferably 10 $\lambda/2$ or less.

We also prefer that the anti-reflection coating has an optical pathlength of 25 $\lambda/2$ or less, and preferably that it comprises the following layers in the following order in a direction away from active region (b):

(i) a layer having an optical pathlength of $\lambda/4$ and having a lower refractive index;

(ii) at least one pair (say from one to twenty especially one to ten usually one to five pairs) of layers each layer being of optical pathlength $\lambda/4$, the layers being of alternating higher and lower refractive indices, the layer closest to layer (i) being of higher refractive index; and optionally (iii) a layer of optical pathlength $\lambda/2$ having a higher refractive index.

When layer (iii) is present we prefer that the active region (b) comprises gallium arsenide; layer (i) comprises aluminum arsenide; the or each layer of higher refractive index of pair or pairs (ii) comprises aluminum gallium arsenide and the layer or layers of lower refractive index of said pair or pairs comprises aluminum arsenide; and layer (iii) comprises aluminum gallium arsenide.

When the layer (iii) is absent we prefer that the active region (b) is selected from the group consisting of indium gallium arsenide phosphide and aluminum gallium arsenide; layer (i) comprises indium phosphide; and the or each layer of higher refractive index of the pair or pairs (ii) comprises aluminum gallium indium arsenide and the or each layer of lower refractive of said pair or pairs comprises indium phosphide.

It should be noted that all layers of higher refractive index need not have the same refractive index, and all layers of lower refractive index need not have the same refractive index. In referring to higher and lower refractive indices, we are merely making comparisons between mutually adjacent layers. Nonetheless, it is preferred that all layers of higher refractive index have refractive indices higher than the refractive indices of all layers of lower refractive indices.

The invention also provides an external cavity laser, comprising:

(a) a first mirror and (b) a second mirror which together with the first mirror defines the external cavity;

the first mirror and the external cavity having a filter function such that when the laser is tuned over 1% (preferably over 5% especially over 10%) of a center wavelength of the filter function, a threshold value of the laser remains below 1000% of its minimum value, preferably below 500%, especially below 200%.

Alternatively, or additionally, when the laser is tuned over 1% (preferably over 5% especially over 10%) of a center wavelength of the filter function, a conversion efficiency of the laser remains above 10% of its maximum value, preferably above 25%, especially above 50%.

The invention further provides a laser sub-cavity comprising:

(a) a first region comprising a layer capable of optical gain at a wavelength $\lambda$ and having an optical pathlength of 20 $\lambda/2$ or less;

(b) an anti-reflection coating on the region (a), having an optical pathlength of 25 $\lambda/2$ or less and which comprises the following layers in the following order in a direction away from region (a):

(i) a layer having an optical pathlength of $\lambda/4$ and having a lower refrective index;

(ii) at least one pair (say from one to twenty especially one to ten usually one to five) of layers each layer being of optical pathlength $\lambda/4$, the layers being of alternating higher and lower refractive indices, the layer closest to layer (i) being of higher refractive index; and optionally (iii) a layer of optical pathlength $\lambda/2$ having a higher refractive index.

The materials referred to above in connection with the laser of the invention may be employed in the sub-cavity of the invention.

The laser of the invention may have a laser diode pump or other light source or an electrical pump for activating the active region (b).

The laser of the invention is of particular benefit for use in intra cavity laser absorption spectroscopy (ICLAS) and may therefore have within the external cavity an analyte cell.

"Bandwidth" as used herein means the width in Hz at half of the peak amplitude of the relevant characteristic.

The free spectral range (FSR) of the sub-cavity, which is the separation between resonances, is given by the expression $$FSR(Hz)=C/(2 \times L_0)$$

where C is the speed of light, and $L_0$ in the optical path length, i.e. the length of the sub-cavity times the average refractive index throughout the sub-cavity. A condition of antiresonance will arise when the optical path length is an odd number of quarter wavelengths at the so-called design wavelength of the laser (in effect the wavelength that is at the center of the filter function). That wavelength is desirably close to (say within 20%, especially within 10%) of the wavelength of maximum gain of the active region, and preferably close to (say within 20%, especially within 10%) of the wavelength of maximum reflectance of the Bragg or other mirror. It is desirable that the bandwidth of the antireflective coating be as broad as possible relative to the FSR, preferably that it be as least half as broad, more preferably at least as broad as the FSR. Although an anti-reflective coating of usefully-broad bandwidth was disclosed in the Sandusky and Brueck paper referred to above, it was used in conjunction with a long sub-cavity, and as a result the benefits of the present invention were not obtained.

In accordance with preferred embodiments of the present invention, an optically—or electrically—pumped vertical external cavity surface emission laser having a design wavelength (as defined above) may include a heat sink structure and a semiconductor structure grown for example by molecular beam epitaxy upon a substrate and attached to the heat sink. As completed the semiconductor structure comprises a multi-layer semiconductor mirror region, such as a Bragg mirror (by which term we include hybrid Bragg mirrors, preferably additionally comprising a metal) generally achieving at least 99 percent reflectance, a single, or more usually a multiple, quantum well active gain region having a length equal to at least one design wavelength and having a plurality of quantum wells, each quantum well being optimally positioned with respect to a standing wave (usually at or close to peaks thereof) in the active gain region at the design wavelength, and an antireflection coating region having a low reflectance at the design wavelength. As completed the sub-cavity of the semiconductor structure has an effective length corresponding to an odd number of quarter design wavelengths so as to operate in anti-resonance at the design wavelength. An external spherical or other suitable lens is positioned separated from the semiconductor structure (for example by means of a spacer structure mounted on the heat sink) by for example a distance not in excess of 10 mm to form a vertical external cavity.

Adaptations and versions of this VECSEL are particularly useful in ICLAS and cavity ring-down spectroscopy (CRDS), and in tunable single frequency lasers and mode-locked lasers, for example those suitable for use in optical telecommunications applications. A preferred fabrication method for making VECSELs in accordance with the present invention is also described.

These and other objects, advantages, aspects and features of the present invention will be more fully understood and appreciated by those skilled in the art upon consideration of the following detailed description of preferred embodiments, presented in conjunction with the accompanying drawings.

BRIEF DESCRIPTION OF THE DRAWINGS

In the Drawings:

FIG. 4 shows the calculated behaviour of a VECSEL structure working at an anti-resonance wavelength of the semiconductor sub-cavity and shows increased homogeneous spectral broadening of the active gain medium over the FIG. 3 design. A $\lambda/4$ thick layer of $Al_{0.19}Ga_{0.18}As$ is added on the top of the $\lambda$ thick active region.

Figure 5:
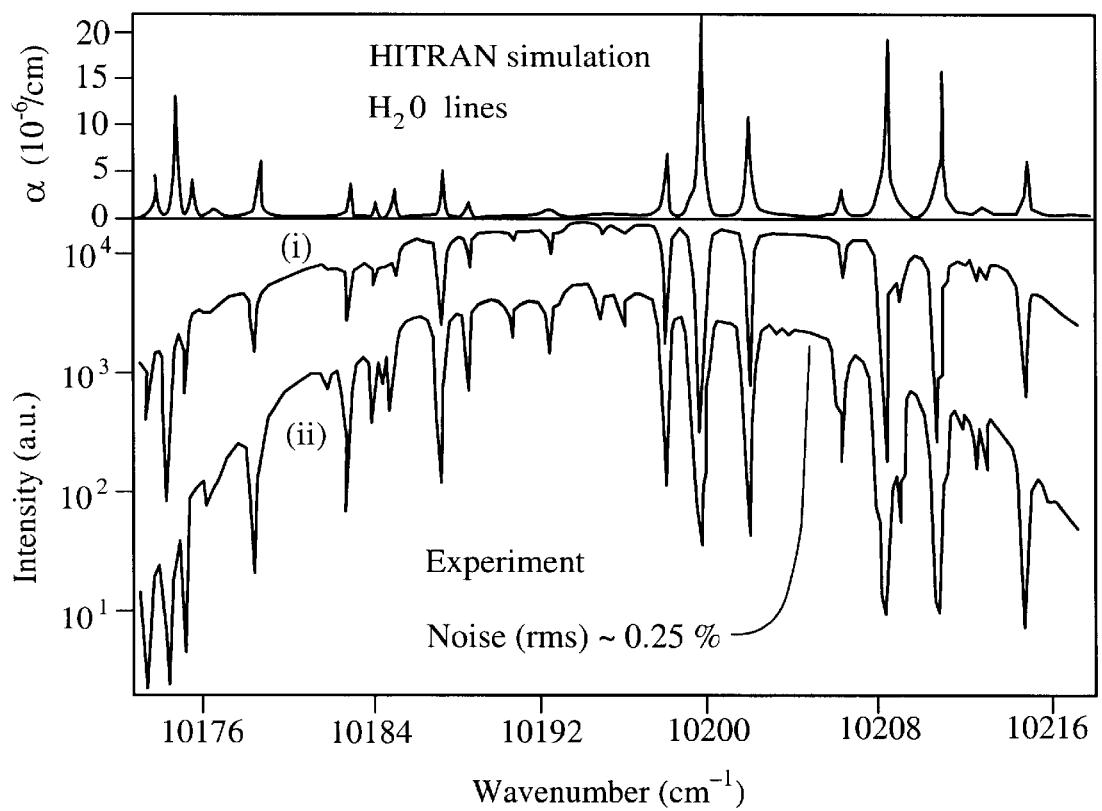

The top graphs of FIG. 5 show absorption lines for water molecules predicted from a HITRAN data base. The two lower graphs (i) and (ii) show two spectra obtained from the FIG. 1 spectrometer which closely correlate to the reference absorption lines.

Figure 6:
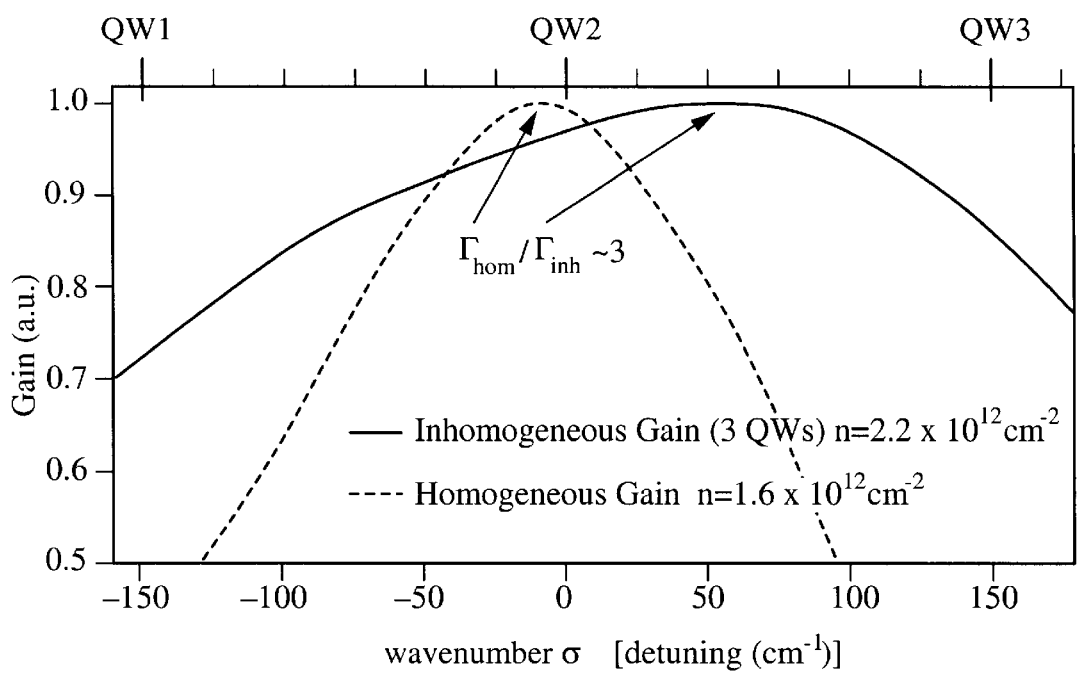

FIG. 6 shows calculated gain for a three quantum well VECSEL structure.

Figure 7:
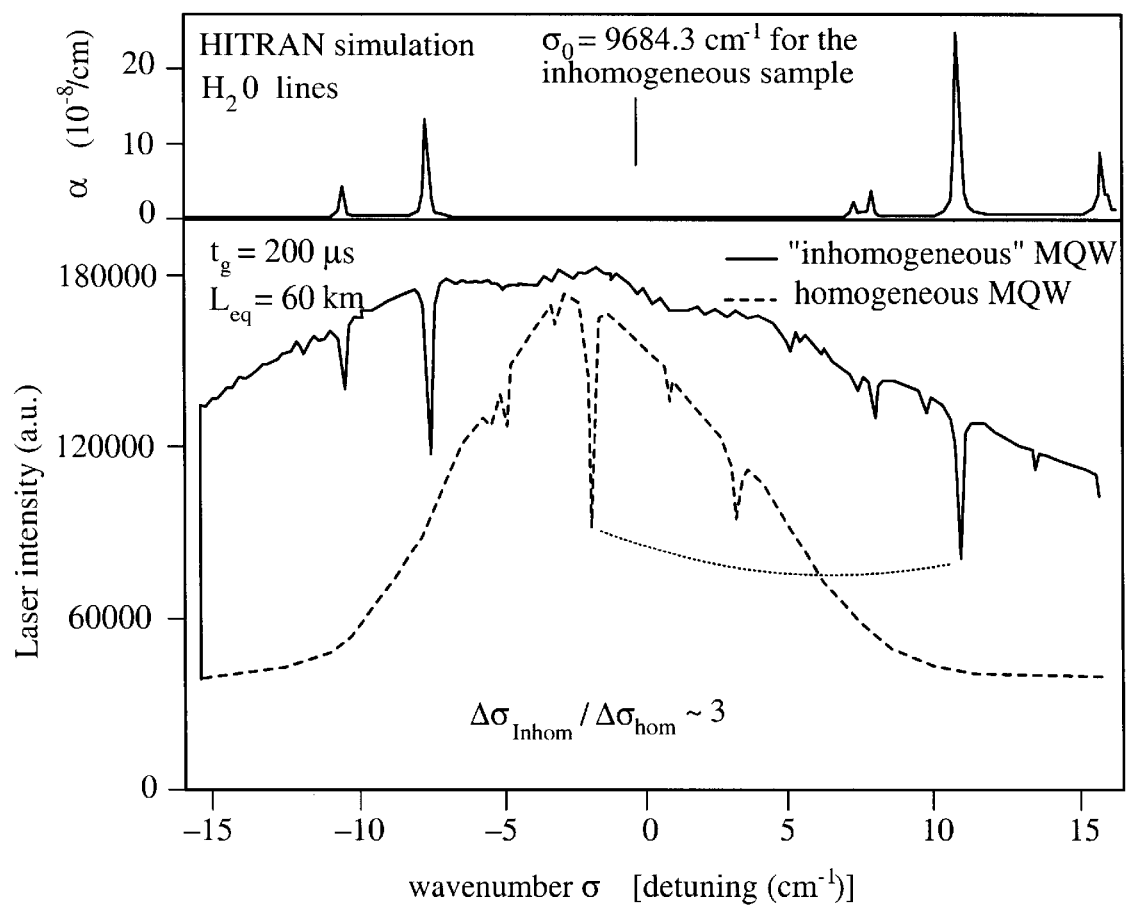

FIG. 7 shows a HITRAN plot and spectra from a laser employing the structure of FIG. 6.

Figure 8:
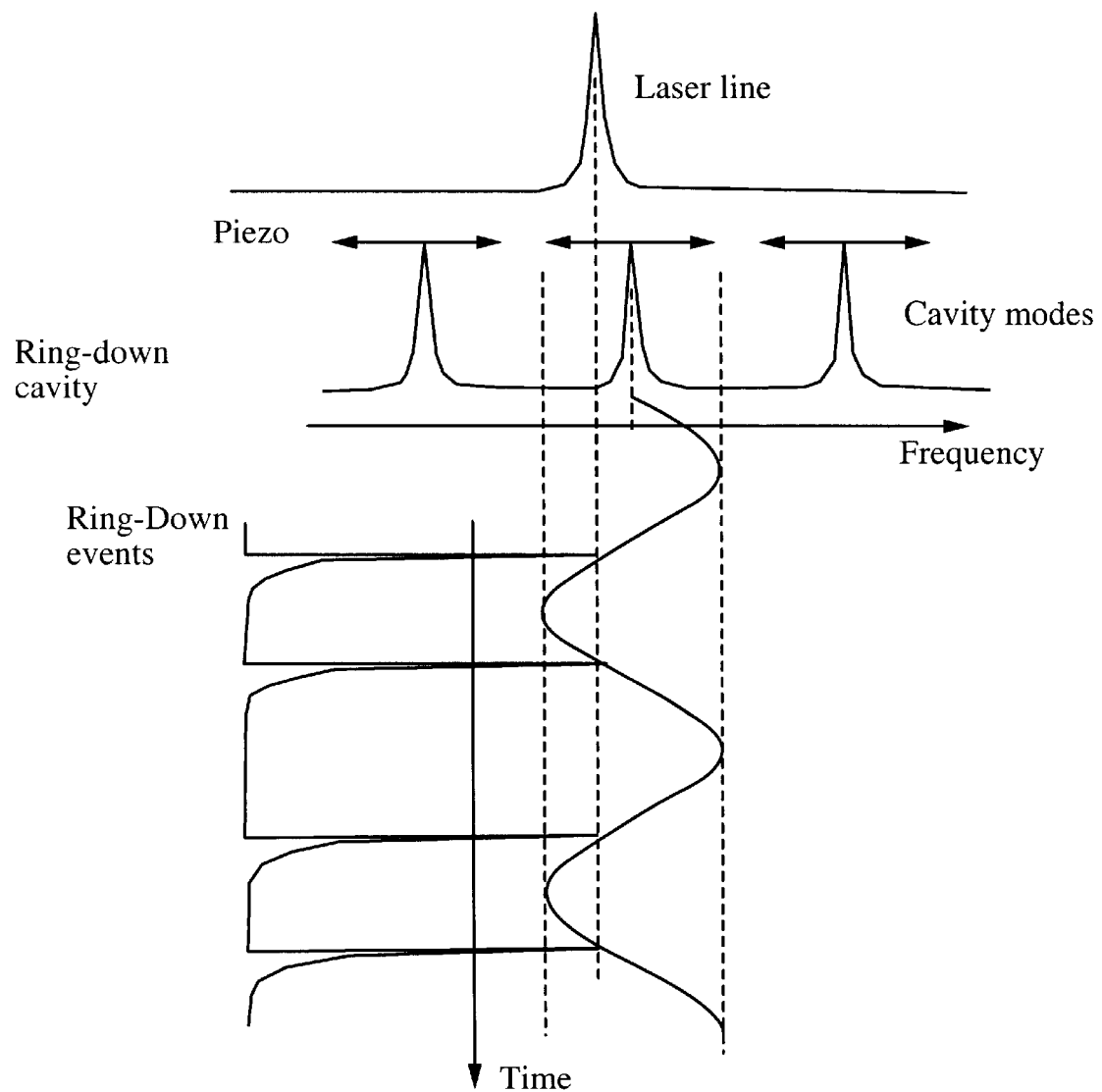
Figure 9:
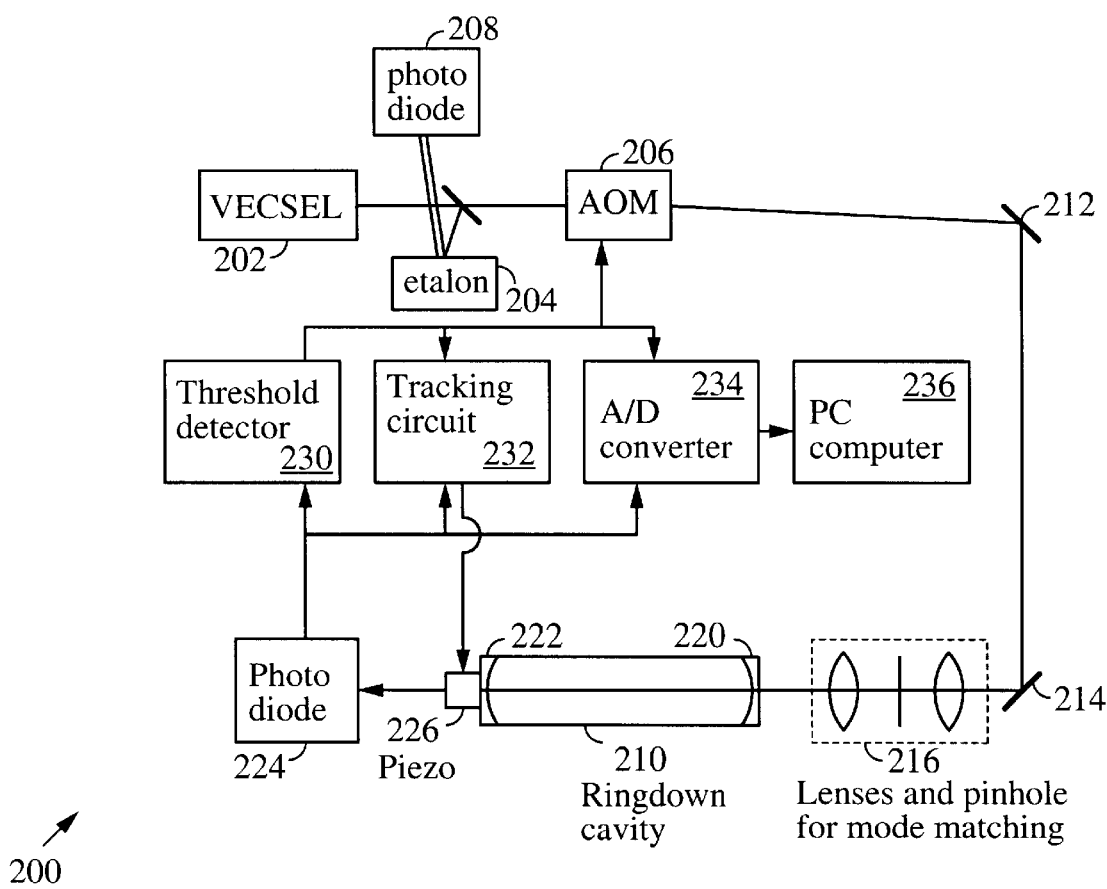

FIG. 8 is a graph of cavity buildup and ring down events as excitation energy passes through resonance of a cavity ring down spectrometer of the type shown in FIG. 9.

FIG. 9 shows a cavity ring down spectrometer excited by a VECSEL in accordance with the present invention operating in a single optical mode with a narrow line width.

Figure 10:
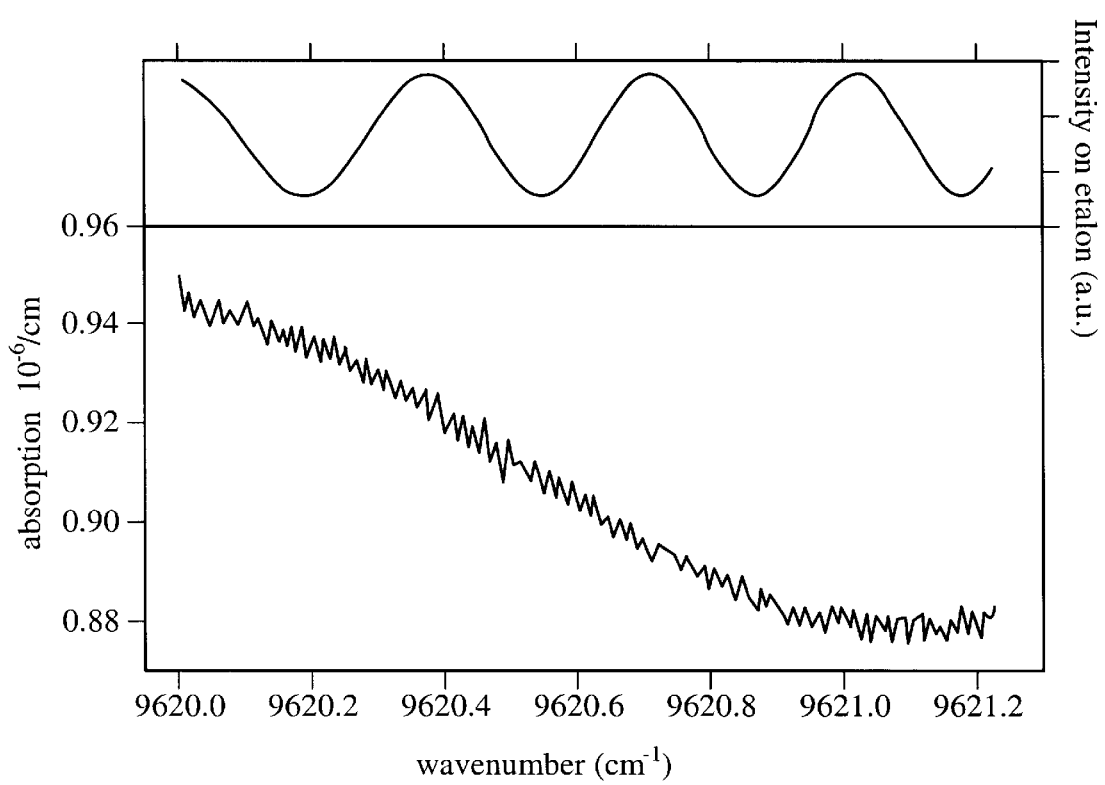

FIG. 10 is a plot of ring down spectra obtained from the FIG. 7 CRDS.

Figure 11:
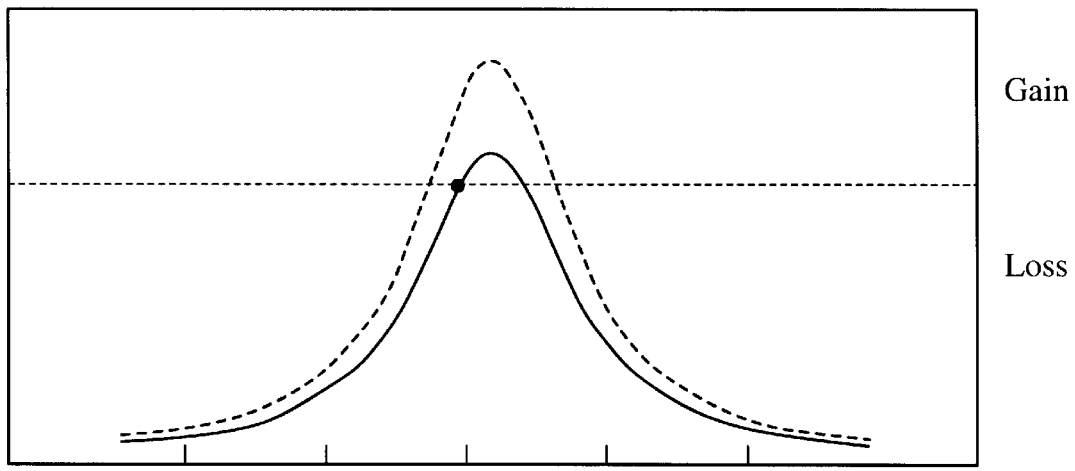

FIG. 11 is a pair of graphs of gain intensity as a function of VECSEL optical mode, showing an initial higher gain and a residual steady state lower gain suitable for exciting a single mode continuous wave operation, rendering the VECSEL output monomode and very useful for mode switching in optical fiber telecommunications.

Figure 12:
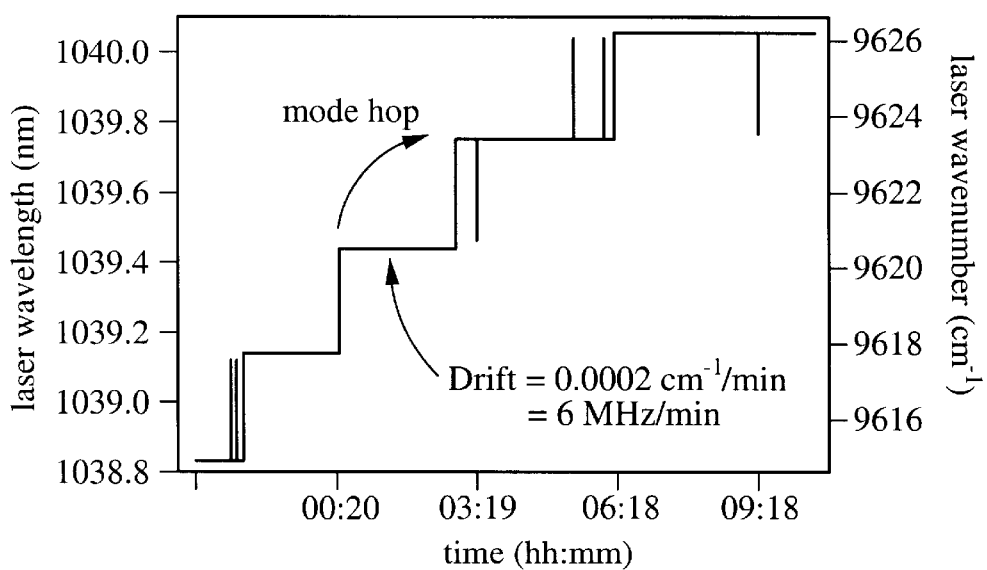

FIG. 12 shows thermally-controlled mode hopping over extended time intervals of a telecom VECSEL in accordance with principles of the present invention.

Figure 13:
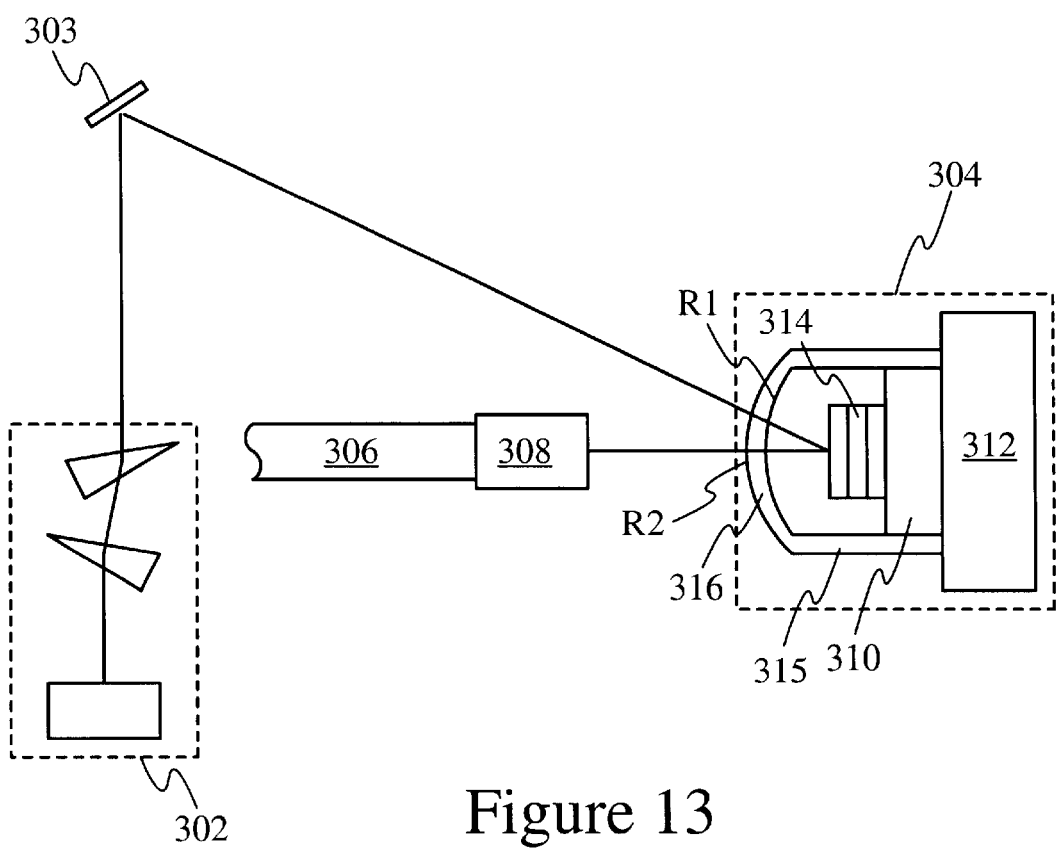

FIG. 13 is a schematic diagram of an optical fiber transmitter unit including an optically-pumped MQW VECSEL in accordance with principles of the present invention.

Figure 14:
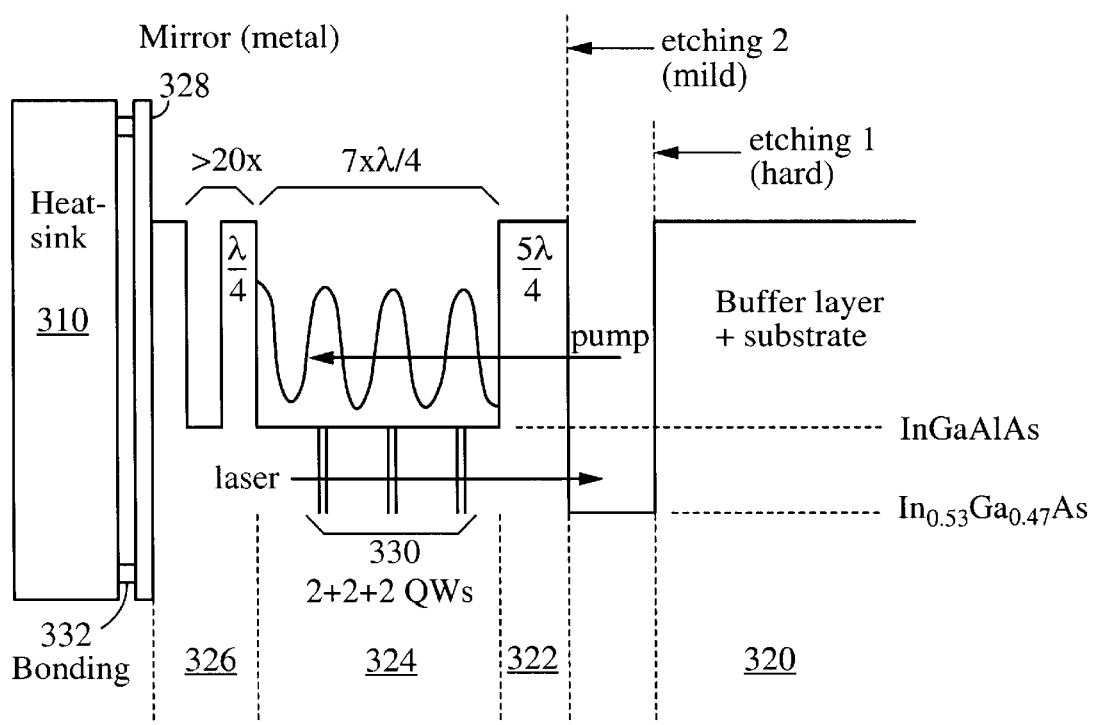

FIG. 14 is a band gap energy diagram of the semiconductor structure of a VECSEL.

Figure 15:
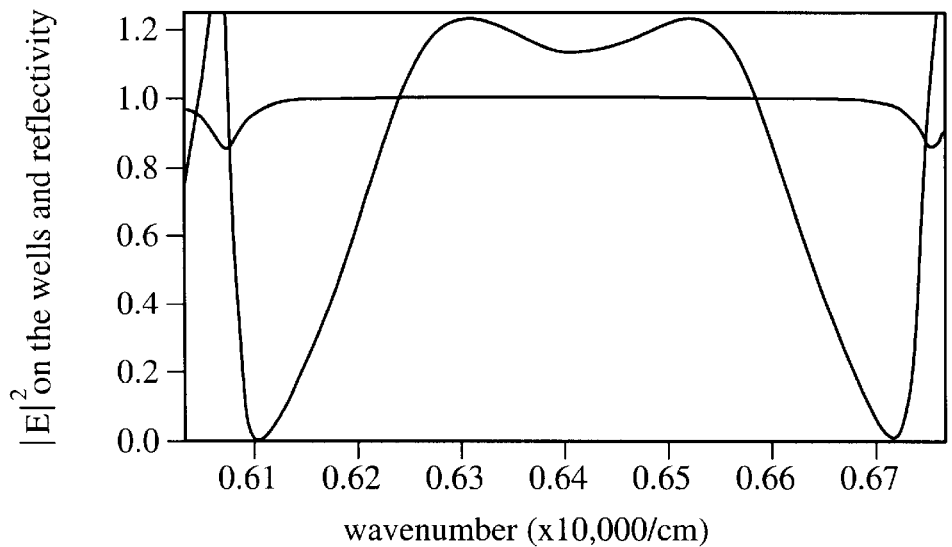

FIG. 15 is a graph of field distribution and reflectivity of the FIG. 12 VECSEL as a function of wave number.

Figure 16:
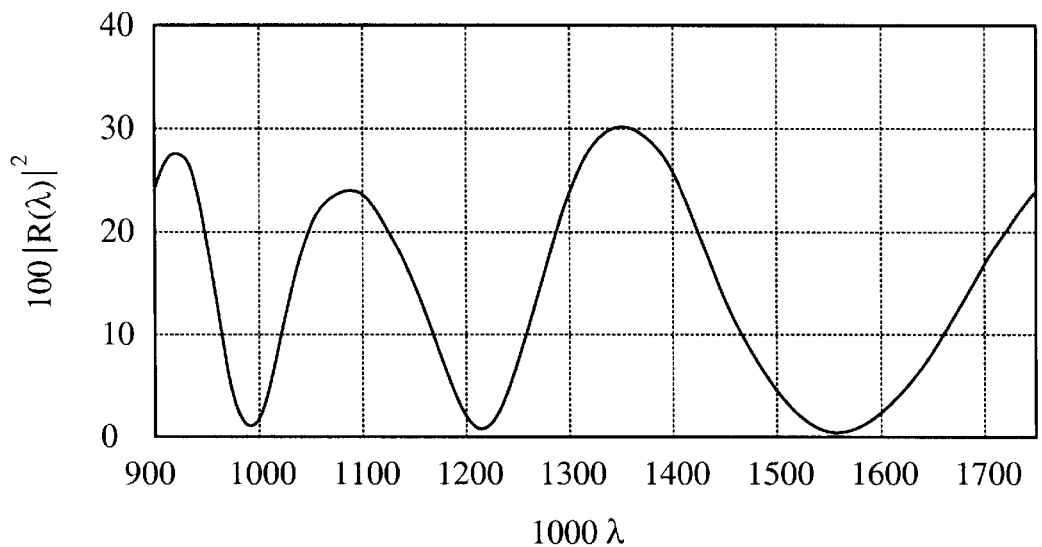

FIG. 16 is a graph of reflectivity of an antireflection layer of the FIG. 11 VECSEL as a function of wavelength.

Figure 17:
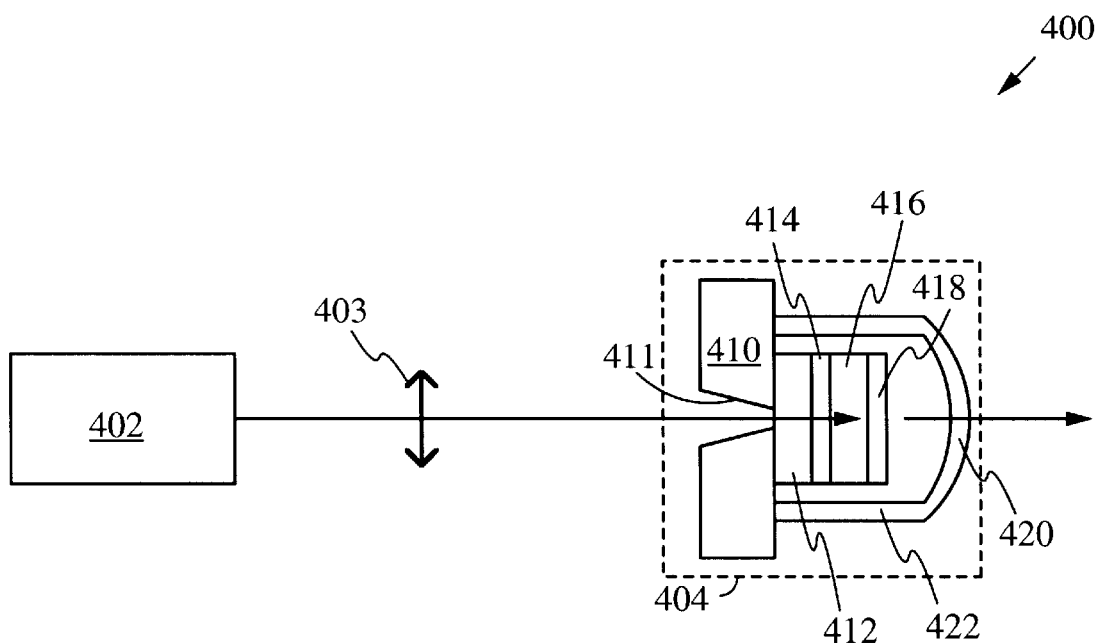

FIG. 17 is a schematic diagram of another optical fiber transmitter unit including an optically pumped MQW VECSEL in accordance with principles of the present invention.

Figure 18:
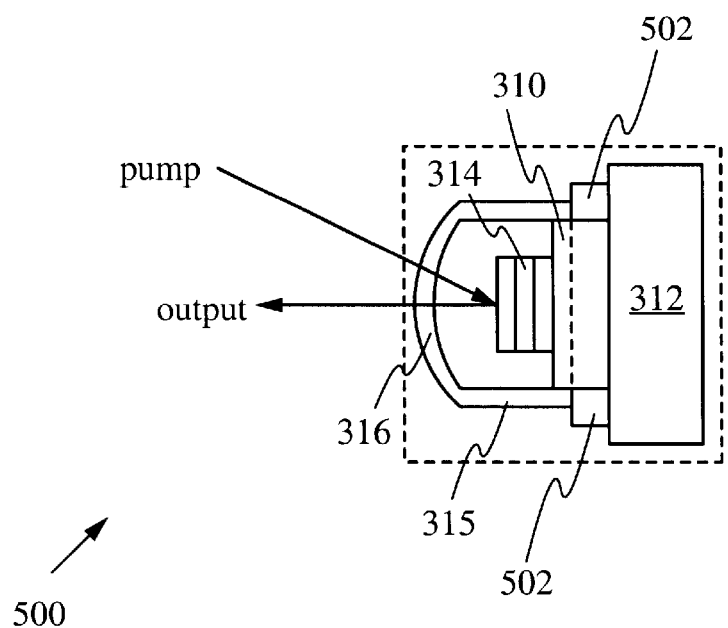

FIG. 18 is a schematic diagram of a MQW VECSEL similar to the FIG. 11 MQW VECSEL with the addition of an annular piezoelectric element for providing micro adjustment of the external cavity length, thereby adding a further wavelength tuning mechanism having a shorter time constant than achievable with thermal tuning.

DETAILED DESCRIPTION OF THE PREFERRED EMBODIMENTS

It has been discovered that a laser having a homogeneously broadened gain medium provides desirable properties not only for optical wavelength absorption spectroscopy but also for telecommunications in that, following an initial startup period of broad wavelength, the output spectrum narrows and the laser operates in a single narrow ($TEM_{00}$) mode with first side mode intensities lower than (50 dB).

EXAMPLE 1

VECSEL FOR ICLAS

Various aims in designing preferred VECSEL gain structures for ICLAS include maximising laser line width for any given generation time, minimizing total intra-cavity losses, and increasing the tunability of the laser. As we presently prefer a multiple quantum well gain structure, we have to take into account multiple reflections inside the active region and in the layers of the Bragg mirror and of the antireflection coating. The effective gain will be proportional to the product of the actual gain and the square of the electric field at the MQW locations.

The sub-cavity between an interface with ambient air at the top surface of the VECSEL semiconductor structure and the Bragg mirror acts as a strong intra-cavity Fabry-Perot etalon, due to the high refraction index of semiconductor materials. Resulting Fabry-Perot peaks, spaced evenly in wavelength by much more than the gain bandwidth, can strongly reduce the laser line width and wavelength tunability. This suggests a shortcoming of resonant periodic gain configurations proposed in the prior art where each quantum well is placed at an anti-node of an intra-cavity standing wave. The active region is too large so that Fabry-Perot peaks attributable to the sub-cavity are too narrow. In addition, the resonant periodic gain structure narrows the effective gain bandwidth even further as it reduces the stimulated emission rate at wavelengths for which antinodes in the laser field are displaced away from the wells. Consequently, we have discovered that the active region length, and in general therefore the number of wells, have to be kept at as small as possible, with the extreme minimum case being one quantum well positioned in the middle of a one wavelength thick active region. Since a small number of quantum wells has to be pumped more strongly in order to achieve the same gain, additional benefits are larger gain bandwidth and smaller spontaneous emission rate.

Figure 1:
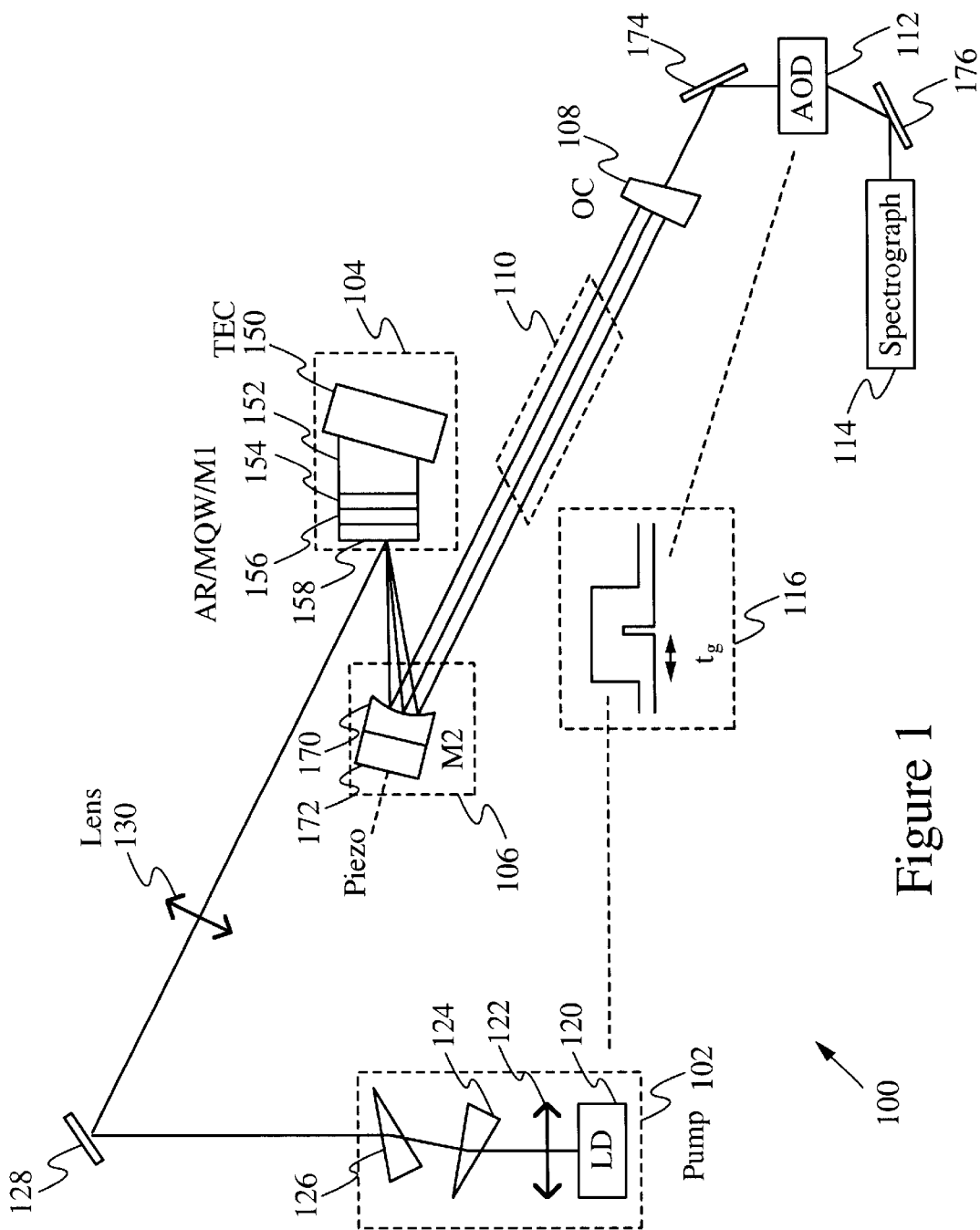
FIG. 1 is a highly schematic diagram of a VECSEL in accordance with principles of the present invention within an intra-cavity absorption spectrometer (ICLAS).

Turning now to FIG. 1 a three-mirror L-shaped diode-pumped broadband VECSEL ICLA spectrometer 100 includes as major components a laser diode pump structure 102, a VECSEL structure 104, an external curved mirror 106, an optical coupler 108, an analyte cell 110, an acousto-optic deflector 112, a spectrograph subsystem 114 and a control system 116. The optical components 102, 104, 106, 108, 110, 112 and 114 are mounted upon or registered to a thermally isolated, mechanically rigid base, such as a large copper plate (not shown).

The laser diode pump structure 102 preferably includes a temperature-controlled single transverse mode 150 mW laser diode, type SDL-5422-H1, emitting at 808 nm, with a 3×1 square micron emitting surface. The highly divergent pump diode beam may be collimated by a 3.1 mm focal length aspheric lens 122, e.g. Geltech 350200, and circularized by an anamorphic prism pair 124, 126. The beam is then reflected by a directing mirror 128 and focused into the active region of the VECSEL structure 104 by a 150 mm plano-convex lens 130. The angel between the VESCEL cavity axis and the pump beam is minimized to, for example, approximately six degrees. The focused pump spot and the mode spot diameter are approximately 60 microns (@$1/e^2$) on the chip surface. The pump radiation may be switched on and off by modulating the current of the laser diode 120 with a square wave generated within the control subsystem (the square wave generator pulse is applied to the current modulation input of the laser diode power supply). A Ti:sapphire laser may be used for high pump powers. In order to control the generation time, the acousto-optic deflector 112 is switched on for a short time with a delay tg with respect to the leading edge of the pump. Thus, a short slice of laser radiation may be sent to the high resolution spectrograph 114 with a photodiode array in its focal plane, as is conventionally practised in ICLAS.

Figure 2:
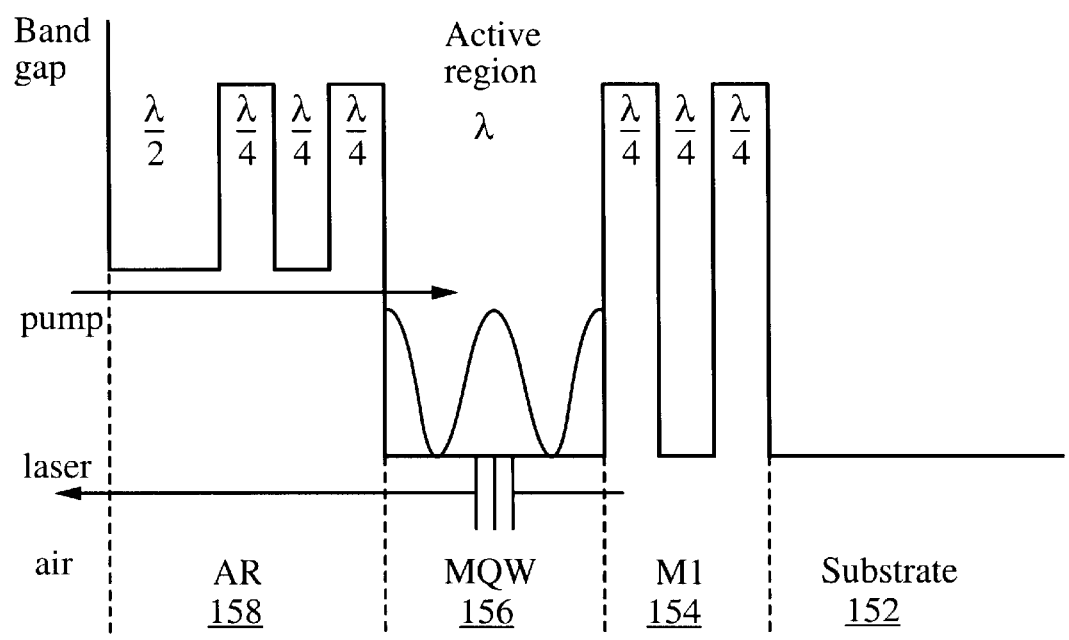
FIG. 2 is a band gap energy diagram of the semiconductor structure of the FIG. 1 VECSEL.

FIG. 2 shows our preferred VECSEL semiconductor structure 104 in terms of relative band gap energy levels of the various structural layers. The VECSEL structure 104, is grown by molecular beam epitaxy on a two inch diameter, 0.5 mm thick gallium arsenide substrate 152. The bottom stack 154 may be a standard Bragg mirror and preferably comprises 25.5 paris of AlAs/GaAs quarter wave layers with cumulative measured reflectivity of 99.94 percent at the VECSEL design wavelength (for example 980 nm). The QW active region 156 comprises an appropriate number, say from one to five, preferably three strained quantum well layers of separated by barrier layers. Suitable quantum well layers comprise $In_{0.2}Ga_{0.8}$. As of say about 7 nm thickness, and suitable barrier layers comprise GaAs of say about 10 nm thickness. Two GaAs layers are placed around the QW active region 156 so that the well or set of wells is placed at a maximum of the intra-cavity standing-wave and the active region is about one wavelength long. An AlAs or other suitable quarter wave layer is then grown in order to confine the photo-excited carriers within the gain region. Three pairs of $A_{0.19}Ga_{0.81}As$/AlAs or other suitable quarter wave layers followed by an $Al_{0.19}Ga_{0.81}As$ or other suitable half wave layer are added on top in order to create an antireflection (AR) coating 158 at the laser design wavelength. Due to the higher energy gap of these materials, the 808 nm pump radiation is not absorbed inside the AR coating 158. The calculated reflectivity of the AR coating 156 for the 808 nm pump radiation is close to 30 percent, so that about 70 percent of the pump radiation reaches the active region. GaAs layers in the active region 156 absorb approximately 40 percent of the transmitted pump energy; excited carriers then drop into the InGaAs quantum wells to provide gain near 980 nm. The overall coupling efficiency of the pump 102 is then approximately 28 percent. A 10 nm GaAs or other suitable layer on top of the whole structure helps to avoid surface contamination.

A 15 mm by 10 mm chip is cleaved from the substrate 152 with a long side parallel to the radius of the wafer. The chip substrate is then mechanically polished to form e.g. a 3 degree wedge between its back surface and the Bragg mirror. This angle avoids feedback due to reflection from the back surface of the substrate. The thin part of the chip wedge is oriented along the radius of the wafer. The chip is then soldered (for example with indium) to a copper or other heat sink mounted on a thermoelectric cooler element 150. Fine wavelength tuning can be achieved by changing the chip temperature. For long-range tuning a translation stage is used to move the sample parallel to its surface along the radius of the wafer (long chip axis) to bring parts of the sample of different thickness into play.

In this example the reflection coefficient of the AR coating 158 increases quite rapidly on each side of the design wavelength. A first impression might be that a much better result would be achieved by using a single dielectric quarter wave layer for the AR coating 158, and in that case the AR coating 158 could have a much broader spectral range. However, a large AR coating bandwidth on a semi-infinite medium is not exactly the property desired in this first example. Rather, we would prefer to increase the laser line width. By taking into account the waves reflected from the rest of the semiconductor structure 104, including the active region 156 and all layers of the Bragg mirror, the multi-layer AR layer 158 results in even larger effective gain bandwidth than that of the material gain itself. The AR coating 158 may be grown in the same epitaxial process used to grow the gain structure.

Figure 3:
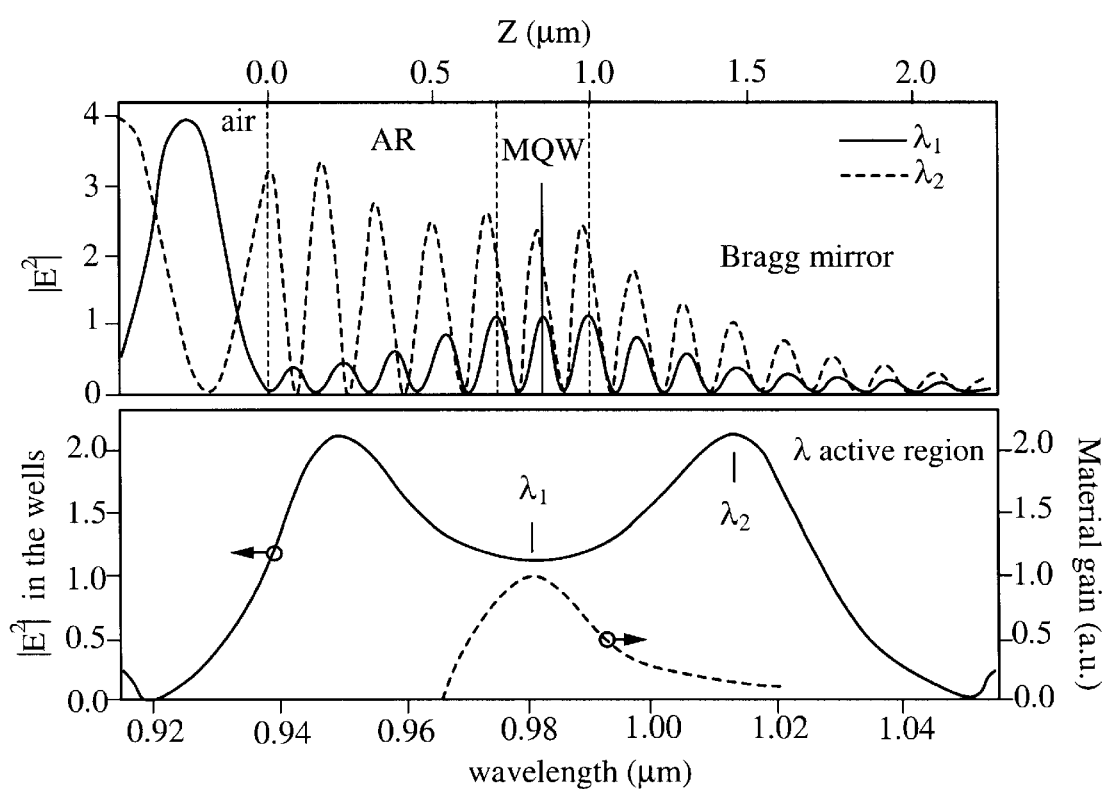
FIG. 3 is a series of graphs showing calculated behaviour of the FIG. 1 VECSEL structure where an antireflection coating stack is added onto the top of a wavelength-thick active region. The incident electric field value $E_{incident}$ is normalised to unity. The top graph shows spatial distribution of the squares of the electric field in the VECSEL structure at the design wavelength and at one of the resonance wavelengths of the structure. The bottom graph solid line shows wavelength-dependence of the square of the electric field in the quantum wells of the active region.

The spatial distribution of the square of the absolute value of the electric field $[E]^2$ inside the semiconductor structure 104 and the wave number dependence of $[E]^2$ in the wells is shown in FIG. 3. The AR coating has zero reflection at its design wavelength; consequently, the energy flux in the air and in the active region 156 is the same for both an incident and for a reflected wave. Thus, $[E]^2$ in the active region is lower than it is in air by a factor $n_{GaAs}$, equal to the optical index of GaAs.

From the bottom plot of FIG. 3 it is seen that $[E]^2$ in the quantum wells increases and then decreases with wavelength as illustrated by the two resonance peaks positioned symmetrically either side of λ. The origin of these peaks is easily explained, as follows. The reflection at the semiconductor to air interface is significantly larger than the reflection at each interface between the layers in the active region 156, due to the small refractive index difference. Thus, the space between the semiconductor/air interface and the Bragg mirror forms a sub-cavity. The sub-cavity length at the design wavelength is an odd multiple of λ/4, so that the sub-cavity operates in antiresonance. Therefore, the electric field amplitude at the quantum wells or wells is at a minimum. At some wavelength $\lambda_2$ the length of the sub-cavity becomes a multiple of $\lambda_2/2$ (a resonance condition), and the electric field in the active zone builds up to its maximum value. The $[E]^2$ value in the quantum wells is somewhat smaller that this maximum value because the values of $\lambda_2$ are greater than the value at λ, and also because of reflective phase shift in the Bragg mirror stack 154. The shape of the FIG. 3 graph is characteristic of a laser having a homogeneously broadened active gain medium, such as VECSEL 104.

In general, we prefer that the filter function has a dip at (or adjacent) its center wavelength. An example of this is shown in FIG. 3. Preferably the ratio between $[E]^2$ at the minimum of the dip and the value at the maximum of the peaks either side of the dip is at least 0.1, for example at least 0.5. Also, we prefer that the bandwidth of the dip is less than 5 times the material gain bandwidth. (The bandwidth of the dip is the width where the value of $[E]^2$ is mid-way between the minimum of the dip and the maximum of the peaks.) In this way, the effective gain (material gain times $[E]^2$) has a bandwidth greater than the gain bandwidth.

Figure 4:
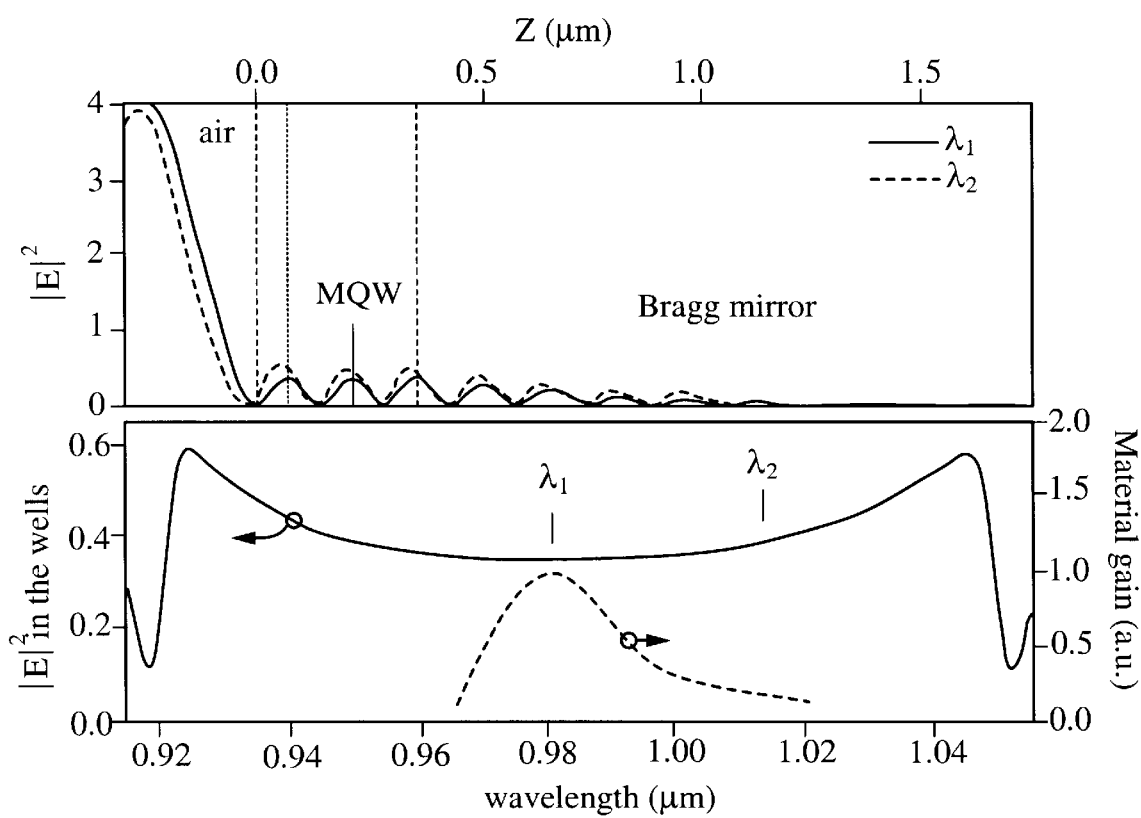
FIG. 4 is similar to the FIG. 3 series of graphs.

If it is assumed that optical losses (e.g. mirror transmitivity, scattering, absorption in the active medium) are wavelength independent, the line width of the VECSEL 104 will be determined by the effective gain, which is proportional to the product of $[E]^2$ and the actual gain. The gain wavelength dependence calculated for a carrier density $n=1.6\times10^{12}$ cm$^{-2}$, which is close to the threshold carrier density in the VECSEL 104, is shown by a dashed line on the bottom plots in FIGS. 3 and 4. The effective gain bandwidth becomes larger than the material gain bandwidth because $[E]^2$ increases in the wings of the material gain. Consequently, the laser line width will be larger than it would be in the absence of the antiresonant sub-cavity (ideal AR coating 158). A more rigorous analysis, wherein a combination of gain and mode losses of the two coupled cavities is considered, gives the same result.

If the temperature of the VECSEL structure 104 is changed, for example by temperature control via a thermoelectric cooler 150, the positive gain portion of the curve will be shifted to longer or shorter wavelengths. The VECSEL will remain in a good lasing condition as long as the positive gain remains in the area between the two resonance peaks. This property is favourable for laser tunability. Such a structure may also be used for applications other than ICLAS, where large bandwidth and improved tunability are needed, such as femtosecond lasers or narrow band tunable lasers. For high power laser applications this VECSEL structure 104 has an additional advantage of reduced damage at high intra-cavity power levels, since at the wavelength of the gain maximum a node of the standing wave is present at the air-semiconductor interface where the density of impurities and defects is high.

If one were to omit the antireflection layer 158, the resulting semiconductor structure would be simpler and of the type we reported upon in the Jun. 15, 1999 paper in Optics Letters discussed above. However, in that case, Fresnel reflection at the semi-conductor/air interface between the gain structure and the external cavity will be present at any wavelength. A simple structure can be obtained by replacing the present AR coating with a half wave layer of, for example, $Al_{0.19}Ga_{0.81}As$. Such a layer, which has a higher bandgap energy than the active zone material, GaAs, would be needed in order to prevent carriers from diffusing to the semiconductor surface. The refractive index of $Al_{0.19}Ga_{0.81}As$ is very close to $n_{GaAs}$, and this hypothetical structure will therefore behaves optically like a single layer on top of a Bragg mirror with a thickness of 3λ/2 (resonance condition). The air-interface/Bragg mirror sub-cavity now operates at resonance, and the maximum of the effective gain coincides with the resonance peak. The effective gain bandwidth in this case is obviously narrower than the material gain bandwidth. This approach therefore does not result in a VECSEL having a broad laser spectrum and broad tunability. Indeed, if the laser spot position were shifted along the wafer to a position of different, or if thickness the temperature of the structure is changed, the result would be a variation in the quantum well bandgap and in a shift in the resonance peak. The central emitting wavelength of quantum wells increases noticeably faster than does the resonance peak position, when either thickness or temperature increases. Thus, with such a structure the wavelength tuning range will be significantly reduced as well as the laser line being narrowed. In addition, such structure does not seem to be a very good choice for high power VECSELs. Heating of the active zone will shift the gain maximum away from the resonance wavelength, which can terminate the laser operation, or at least, decrease laser efficiency. The situation gets even worse if it is necessary to increase the sub-cavity length in order to add more quantum wells and thus totally absorb the pump radiation and achieve higher gain. Then the narrow resonance peak will completely determine the spectral and tuning properties of the laser. An example of this extreme case is the pronounced thermal roll-over behaviour of conventional VCSELs operating at the resonance frequency of their high finesse microcavity. The only advantage to be gained by operating at the wavelength of the sub-cavity of a VECSEL is a possible reduction of lasing threshold, since $[E]^2$ in the wells is about three to four times higher than when first having to pass through the AR coating. Such a structure might therefore be useful in situations calling for use of low gain semiconductor materials.

We now propose a VECSEL design for spectroscopy which, unlike the immediately preceding design, is designed to operate in anti-resonance. To achieve anti-resonance one may to decrease the thickness of the top $Al_{0.19}Ga_{0.81}As$ layer to one quarter wave. The results are presented in FIG. 4. As a consequence of the shorter sub-cavity length, the resonance peaks are more widely spaced and thus such a structure can have broader tunability.

The FIG. 2 VECSEL 104 operates continuous wave (CW) at room temperature in a high quality single transverse (TEM00) mode with its radiation spontaneously polarized along the {110} crystal axis at all pump intensity levels. The polarization can be rotated in any direction by inserting a Brewster angle window, at the sample cell 110 for example, but operation at natural polarization is slightly more efficient. The threshold is as low as 100 mW of incident power for an emitting wavelength of 980 nm. No effects due to thermal lensing or temperature-induced mismatch between the gain maximum and the design wavelength have been observed. The laser output power depends linearly upon the pump power, with a slight nonlinearity at high power. The calculated external slope efficiency from 80 mW output with 1 W of pump power is approximately 9 percent. Internal single pass losses are estimated to be approximately 0.1 percent, based on output to pump power dependence and known reflectivity of the output coupler 108.

The temperature tuning coefficient of the laser wavelength was measured at approximately 0.45 nm per degree C. in the temperature range of 0–60 degrees, C., when the lasing spot position was in the center of the sample. Temperature tuning is due to the temperature dependence of the InGaAs quantum well band gap. Temperature tunability of the VECSEL 104 is much more rapid than typical tunability of conventional VCSELs (approximately 0.1 nm per degree C.), which is due to temperature dependence of the resonance frequency of the micro-cavity. A combination of temperature change and sample translation provides an overall tunability range between 963 and 990 nm. Bandwidth of the VECSEL radiation can also be increased by giving the quantum wells different emitting wavelengths by varying the width of each quantum well during the fabrication process.

FIG. 5 shows two absorption spectre of ambient air in sample cell 110 of the spectrometer 100, taken over two values of generation time. Atmospheric water has, in the operating range of the VECSEL 104, relatively strong absorption. Therefore, one can see saturation of stronger absorption lines at a tg of approximately 60 microseconds, which corresponds to an equivalent absorption path length $L_{aq}$ of approximately 18 kilometers. In spectral plots (i) and (ii) shown in FIG. 5, 6000 spectra have been averaged with a total acquisition time of 7 seconds. The signal to noise ration (S/N) of 400 achieved in spectrum (ii) corresponds to a detection limit of approximately $10^{-9}$ $cm^{-1}$ even at this relatively short generation time. It corresponds to a normalized detection limit of approximately $10^{-10}$ $cm^{-1} H_3^{-2}$. No spurious structure is present in the spectrum caused by the outer surface of the semiconductor structure. However, weak high frequency fringes are evident due to wavelength-selective scattering of the standing waves in the linear cavity on the surface of the folding mirror structure 106 despite the very high reflection coefficient of this mirror (greater than 99.95 percent), and thus its low scattering. At some defects-free positions of the laser spot on the M2 surface these fringes disappear, but a more radical solution is to dither the mirror element 170 with the piezoelectric transducer 172 during the averaging process.

The wedge-shaped substrate 152 precludes a return of the wave directly reflected from the rear surface of the substrate back into the VECSEL's external cavity and consequently prevents modulation of the output spectrum, which was a problem with the device reported upon in the Optics Letters paper of June 1999 noted above. However, a relatively weak modulation (approximately 10 percent modulation depth at time $t_g$ equals 100 microseconds) was visible, which is most likely due to diffuse scattering from the indium solder which secures the wedge-shaped substrate 152 to the heat sink-cooler 150. The smooth spectra presented in FIG. 5 could be obtained by placing the pump laser spot on the thinnest part of the VECSEL semiconductor (less than 50 micrometers).

In general for certain embodiments we prefer that the active region of the VECSEL structure comprises, for example, two or three quantum wells, and that the gain peak wavelength of the quantum wells is shifted by less than two times the homogeneous gain bandwidth of one of them. In that way, the effective gain summed over all of the quantum wells gives a bandwidth for the total effective gain greater than the gain bandwidth of each well alone. In addition, the curvature at the peak of the total effective gain will be flatter. Such a design is particularly suitable for ICLAS and for continuously tunable single frequency lasers. Reference may be made to FIGS. 6 and 7. FIG. 6 shows calculated gain for a VECSEL structure having three InGaAs/GaAs quantum wells with a wavelength shift of 15 nm at 1000 nm. The broadened inhomogeneous gain can clearly be seen. FIG. 7 shows at the top a spectrum for water from the Hitran database, and at the bottom an experimental spectrum obtained using the same structure as was used for FIG. 6. The spectrum in the inhomogeneous case can be seen to be considerably braoder.

In the FIG. 1 spectrometer 100 no additional noise is associated with wavelength tuning, because the VECSEL wavelength can be temperature-tuned with the thermoelectric tuning unit 150 or by MQM structure displacement. Therefore, it is practical to achieve S/R of 300 at $t_g$=1.5 ms, which corresponds to an equivalent path length of 450 kilometers and a detection limit lower than $10^{-10}$/cm. The spectral width at this generation time is already reduced to about 3 $cm^{-1}$, which is only 15 times larger than the width of the water lines, which makes impractical any further increase in generation time. This represents a practical value for the detection limit of the FIG. 1 spectrometer 100. This detection limit is, however, a rather good value for practical applications of a compact diode pumped VECSEL ICLAS system for ultrasensitive gas analyte detection. If one takes as an example a strong absorption line of water at 7327.7 $cm^{-1}$ near 1.3 microns, it will have at a 1 ppb concentration an absorption coefficient equal to $2 \times 10^{-9}$ $cm^{-1}$. We can therefore expect the concentration detection threshold to be less than 100 ppb.

EXAMPLE TWO

VECSEL FOR CRDS

After about three seconds the initial broadband spectrum of the FIG. 2 VECSEL collapses into a narrow line only 13 mode wide. Further, the narrowing continues until a single longitudinal mode is produced after approximately 500 seconds. The time constant of the narrowing will be dependent upon the initial width of the laser radiation divided by the bandwidth of the gain which is generation time multiplied by the loss rate inside the cavity (inverse of photon life). If the cavity finesse is very high, it means that the loss rate will be very low. FIG. 11 illustrates single mode operation of VECSEL as a function of optical mode. It is possible to tune the frequency output of the laser in a range from 1020 to 1060 nm simply by translation of the semiconductor structure relative to the pump radiation, as previously noted. A mode-hop-free tuning range of about 30 GHz has been achieved by simultaneous translation of the output coupler (with a piezoelectric transducer) and semiconductor temperature change. Within a closed, temperature stabilized environment the FIG. 2 VECSEL laser demonstrates a very stable frequency drift of about 6 MHz per minute. The present VECSEL is significantly simpler to manufacture and operate, and has superior performance, than diode lasers tuned with an external cavity diffraction grating in the Littman-Metcalf configuration. The very low intra-cavity losses of VECSELs result in extremely small single mode line widths. The mode width, SV1 (FWHM) in CW operation is given by the known Schalow-Townes formula in the case where phase fluctuations are exclusively generated by spontaneous emission. For the FIG. 2 VECSEL one finds that $\delta VL$ approximates 0.1 Hz with 1 mW of output power. In addition VECSELs are relatively insensitive to feedback due to the long photon lifetime in the cavity. This is a very attractive feature for CW diode laser cavity ring down spectroscopy.

Cavity ring down spectroscopy (CRDS) was initially presented by O'Keefe and Deacon in an article entitled "Cavity ring-down optical spectrometer for absorption measurements using pulsed laser sources", Rev. Sci. Instrum. Volume 59, No. 12, December 1988, pp. 2544–2551, and is the subject of further later investigations and proposals, see e.g. U.S. Pat. No. 5,528,040. FIG. 8 illustrates the principle of CW-CRDS: buildup and ring down events as the ring down cavity resonance passes through a narrowly monochromatic laser excitation line, as taught by Romanini, Kachanov and Stoeckel in an article entitled "Diode laser cavity ring down spectroscopy", Chem. Phys. Lett., Vol. 270, 1997, pp. 538–547. The disclosures of each of these three documents are incorporated herein by reference. FIG. 8 illustrates a wavelength-stabilized monochromatic laser excitation line produced by a VECSEL and the adjustment of ring down cavity modes by a piezoelectric element, such that when excitation radiation is removed from the ring down cavity, the ring down events continue for a brief time and fall of generally exponentially, depending upon finesse of the ring down cavity.

FIG. 9 presents a CRDS spectrometer 200 employing a VECSEL 202 operating at a single narrow monochromatic mode, which overcomes certain disadvantages and drawbacks previously noted above with DFB diode lasers, and which further overcomes a need to provide an optical isolator which has previously been required within laser-diode-excited CRDS spectrometers. A Fabry-Perot etalon 204 (ISL~0.32 $cm^{-1}$) is inserted in an optical path from the VECSEL 200 to an acousto-optic modulator 206 to aid maintaining the VECSEL output at a constant single frequency. A photo-diode-based spectrometer 208 having a precision approximating 0.02 $cm^{-1}$ is used for monitoring the VECSEL wavelength and for ensuring that VECSEL 202 is operating monomode. An external ring down cavity 210 receives radiation from the VECSEL via the AOM 206, deflecting mirrors 212, 214, and a mode-matching lens system 216 which phase-matches the VECSEL mode to the ring down cavity. The ring down cavity 210 has a high finesse (F~$10^5$, $\delta v_c$~3 kHz) and is defined by two spherical concave mirrors 220 and 222 having radii of curvature of 100 cm and a separation of 50 cm. A fast photodiode 224 is placed at an exit of the ring down cavity, and its output leads into a threshold detector 230, a tracking circuit 232 and an analog-to-digital converter 234. Digitized signal samples from the fast photodiode 224 are fed into a digital computer 236 which is used to derive the resultant spectra of gas analytes placed within the ring down cavity in accordance with known calculational methods. The output wavelength of the VECSEL 212 is temperature controlled as previously explained in conjunction with the FIG. 1 example. The length of the ring down cavity 210 is controlled by a piezoelectric element 226 coupled to mirror 222, and as shown in FIG. 8, the piezoelectric element 226 moves the ring down cavity into registration with the VECSEL's laser radiation line. Radiation from the VECSEL is periodically injected into the cavity 210 by the AOM 206. Each ring down interval is approximately 50 microseconds long, and several sample spectra are collected and averaged over a suitable period, such as one second.

FIG. 10 shows a ring down spectrum obtainable with the FIG. 9 ring down spectrometer wherein the pumping laser operates at 640 nm in the visible spectrum the VECSEL output radiation is at 1040 nm in the infrared spectrum. The limit of detection is on the order of $10^{-9}$ $cm^{-1}$ over the spectrum having a width of 30 GHz.

EXAMPLE THREE

VECSEL for Optical Fiber Telecommunications System

FIG. 11 presents two plots of VECSEL active gain as a function of wavelength and pumping intensity, and marks a series of VECSEL cavity modes (resonances) across the abscissa of the graph. The dotted line shows initial intensity buildup in the cavity which takes place during the initial startup (and which is of particular interest and importance in the ICLAS example given above). After about one microsecond VECSEL active gain becomes clamped to the average cavity losses, and from the solid-line curve of FIG. 11 it is seen that only the mode closest to the gain maximum will be lasing. Thermally controlled VECSEL mode hopping and stability at each selected mode (following startup phase) as a function of time is shown in the FIG. 12 graph.

By appropriate design, each mode may be made to coincide with an optical telecommunications channel in a fiber channel network, and by thermally controlling the VECSEL active region, a particular channel wavelength can be selected and VECSEL radiation maintained over time at the selected channel without the complex adjustment mechanisms previously required of laser diodes used in prior art optical fiber telecommunications systems. Moreover, given the narrow monomode spectral line width achievable with the VECSEL, it becomes practical to shorten the standard spacing between channels of a fiber optic network, thereby increasing the information bandwidth by addition of more channels within the same system bandwidth. Thus, it is apparent that a VECSEL having a homogeneously broadened active gain region fulfills these objects and requirements of optical fiber telecommunications.

A fiber optic telecommunications transmitter 300 is diagrammatically illustrated in FIG. 13 for putting modulated optical power emitted by a VECSEL 304 into an optical fiber of a communications network operating in the near infrared spectrum, e.g. 1000 nm to 1700 nm. Therein, a laser diode unit 302 puts out optical pumping radiation at a desired wavelength, e.g. 980–1000 nm (1.24 eV at 300 K), and power level, e.g. a $10^{-6}$, channel separation will be maintained within a temperature change of plus or minus ten degrees C. Materials such as Zerodur will ensure mode positions within temperature changes of plus or minus 100 degrees C. The VECSEL absolute cavity length during manufacture should be reproducible within 0.4 micron.

Contemporary optical manufacturing technology can provide thicknesses of optical materials within 0.5 micron. In order to assure that the absolute cavity length is within specification, automatic trimming of the cavity length under optical feedback control is used to meet the required cavity length tolerance.

The external mirror 316 may be a separate element bonded onto the end of the cylindrical spacer 315, or it may be molded integrally therewith. The inner mirror of structure 316 is of a very high reflectance, has a desired spherical radius of curvature R1, and supports a VECSEL cavity of sufficiently high finesse to realise effective single mode lasing operation. The interior ambient environment of the VECSEL may be dry air, nitrogen, or vacuum, depending upon an acceptable scattering/absorption tolerance as may be required by a particular application or embodiment.

The external mirror 316 defines a first highly reflective concave surface having a radius R1 selected to form a high finesse external cavity, and it may have an outer curvature forming a coupling lens of radius R2 for focusing the pumping energy into the active region 324 and/or for focusing the VECSEL laser output beam into an optical fiber 306. VECSEL cavity finesse must be high enough so that the VECSEL will laser, which requires that losses in the laser cavity need to be low enough so that the gain of the quantum wells is sufficient to overcome those losses. An external mechanical/optical coupler 308 may be provided to position a fiber end and couple the VECSEL laser beam into the fiber 306. Other laser/fiber coupling arrangements known in the art may also be employed to position and stabilize the components and to couple effectively the VECSEL laser beam into the fiber.

As shown in FIG. 14, for the exemplary telecommunications transmitter 300, our VECSEL semiconductor structure 314 is grown on a substrate 320 comprising $In_{0.53}Ga_{0.47}As$, where the indium and gallium components are expressed as mole fractions. The structure 314 is grown in reverse order by molecular beam epitaxy. As grown, the first or bottom layer comprises the antireflection evaporation coating 322 of an $\lambda/4$ thick indium phosphide capping layer and an indium/gallium aluminum arsenide layer of a thickness $5\lambda/4$ where lambda represents the VECSEL nominal mid-band output wavelength, 1560 nm, for example. While the indium gallium aluminum arsenide alloy works well for the antireflection layer 322, we have discovered that a silicon nitride layer provides an effective broad band antireflection coating. The function of the antireflection layer 322 is to prevent reflection within the semiconductor structure at the VECSEL lasing wavelength, as opposed to the pumping wave. Since the VECSEL 304 is pumped through the external mirror 316 the antireflection layer 322 should be of a material selected for minimal absorption of energy at the pump wavelength, so that a maximum pump power will enter the active region, excite the quantum well carriers and yield efficient lasing. For telecommunications it is necessary that the antireflection coating 322 is effective across the entire optical communications band, and not just a single channel.

A positive gain, active region 324, having a length $7\lambda/4$, is then formed. It has, for example, three pairs of quantum wells 330 of indium gallium arsenide ($In_{0.53}Ga_{0.47}As$). In the near infrared spectrum quantum wells typically have less gain than in the visible spectrum, and a sufficient number of quantum wells must be provided to yield the needed gain for reliable operation at the desired output power. Each quantum well 330 has a thickness designed in relation to the desired output wavelength at operating temperature (which, because of absorption of the pump energy, will be higher than room temperature). When the active region 324 is pumped, it heats up. When a semiconductor is heated, it changes effective thickness and index of refraction. Accordingly, the emitting wavelength of the quantum wells 330 must be shifted to a higher energy level compared to a room-temperature design wavelength of the structure $\lambda_{QW}$~$\lambda_{DESIGN}$–20/30 nm approximately (at T0–300K, at low excitation), so that the gain and the design wavelength match when the VECSEL 304 is lasing. For a fundamental mode ($TEM_{00}$) operating wavelength of 1560 nm in the near infrared spectrum and at the design minimum of 150 mw and typically 500 mW to 1 W. When excited by e.g. 150 mW of pump power, the VECSEL 304 puts out 5 mW in the infrared spectrum, e.g. 1560 nm, and output power scales up as a function of pump power. A folding mirror 303 directs the pumping radiation toward a VECSEL 304 which has a relatively short cavity of the order of 2 mm between the intrinsic Bragg mirror of a semiconductor structure 314 and an external cavity mirror 316.

Other elements of the VECSEL include a heat sink 310, a thermoelectric cooling/heater system 312 for wavelength control (mode selection), and a semiconductor 314 including the antireflection layer 322, the active gain region 324 and the Bragg mirror layers 326. A cylindrical spacer 315 supports the external mirror 316 in place over the top surface of the semiconductor 314 at a distance establishing the VECSEL close spacing in a range between 1 mm and 5 mm and approximately 2 mm in the present example. The spacer 315 establishes a VECSEL cavity mode separation equal to the wavelength division multiplex ("WDM") channel spacing of the optical telecommunications network. The established WDM telecommunications frequency of 190 THz, with 25 GHz channel spacing requires an accuracy of absolute mode positions equal to 2.5 GHz. In order to provide absolute frequency control of each mode equal to ten percent of the nominal channel spacing, a VECSEL cavity length precision on the order of $1.25 \times 10^{-5}$ is required.

The spacer 315 is formed of a material, such as a molded glass component, (e.g. ULE glass, quartz, Zerodur or Invar or other glass with a low coefficient of thermal expansion) which thermally decouples the external mirror 316 from the semiconductor structure 314, so that temperature regulation of the active region 324 with the thermoelectric unit 312 and heat sink 310 do not vary the length of the VECSEL cavity. The spacer material can be selected to compensate for changes in the length of the semiconductor structure 314 when the structure is heated. For example, if the semiconductor structure elongates with temperature, the spacer material is chosen to expand with temperature by an appropriate amount to offset any change in wavelength otherwise resulting. Fused silica is a suitable material. As shown in the FIG. 14 diagram, each pair of quantum wells 330 is located at a maximum of the active region standing wave. Major separation or barrier layers between the quantum well pairs have a length optimised for an absorption coefficient at the pump radiation wavelength which in this example is 980 nm. FIG. 14 not only shows a diagrammatic cross section of the layers of the semiconductor structure 314, it also plots relative band gap energies of the various semiconductor layers 320, 322, 324 and 326.

A Bragg mirror layer stack is then formed on top of the active region. The Bragg mirror comprises an odd number of layers, greater than twenty pairs, of alternating aluminum arsenide, gallium arsenide quarter wave layers, so that total reflectance within the Bragg mirror at the design wavelength is greater than 99.8 percent. Finally, a metal mirror layer 328, e.g. gold, is sputter-deposited onto the Bragg mirror structure 326 to complete the fabrication of the semiconductor structure within the molecular beam epitaxial process. The metal mirror increases the reflectance from 99.8 percent to approximately 99.98 percent. The effective length between the Bragg mirror 326 and the external surface of the antireflection coating 322 is set to an odd number of nominal output wavelengths, so the sub-cavity formed by the semiconductor structure 314 operates in anti-resonance. The pumping energy passes through an antireflection coating 322 to reach an active region 324 of quantum wells. The Bragg mirror 326 includes at least twenty quarter-wavelength layers pairs. Reflectivity of the Bragg mirror 326 (nominally 99.8 percent) is enhanced by a gold, or gold alloy, layer 328 which increases total rear mirror reflectivity to 99.98 percent. Index matching and phase discontinuity issues are essentially avoided by using both the Bragg mirror structure 326 and the metal mirror 328.

FIG. 15 presents a graph superimposing a sinuous line marking the square of the electric field distribution on the quantum wells 330 and a rather flat, horizontal line marking the reflectivity of the semiconductor structure 314 (without absorption) as a function of wave number (wave number being wavelength in reciprocal centimeters, e.g., a wavelength of 1000 nm equals a wave number of 10000 $cm^{-1}$ and a wavelength of 2000 nm equals a wave number of 5000 $cm^{-1}$). This graph shows that the field is broad and it is maximized in the center on the quantum wells. It shows that the Bragg mirror reflectivity is close to unity across the active region, and is desirably flat across as large a band as possible, and essentially flat as a function of wavelength. The superposition of the two graphs show that the active region gain and the Bragg mirror bandwidth overlap and are centered on each other at the design wavelength. FIG. 16 graphs the reflectivity of the single antireflection coating layer 322 as a function of wavelength in nanometers, and shows that at the design wavelength of 1560 nm the reflectivity is minimized, and also desirably reaches a minimum at the pump wavelength around 980 nm.

After the epitaxial deposition processes are completed the substrate 320 is progressively removed, first by a step of abrasion, such as ion beam milling, followed by a second step of wet chemical etching with an etching agent which favours removal of the gallium arsenide substrate 320 (rather than the indium phosphide capping layer within the antireflection layer 322). The metal mirror layer of a said chip 314 is then bonded, e.g. by indium solder 332, to the copper heat sink 310. The wafer is then cleaved into dice or chips, each chip is forming a semiconductor structure 314. By removing the substrate 320 in this preferred reverse order formation process, thermal control of the active region 324 via the thermoelectric element 312 and the heat sink 310 is much more direct and positive, than if the heat had to be conducted through the substrate, as is the case with other conventional VECSEL and VCSEL designs.

A suitable modulator, such as an optical element or grating having a current-modulated index of refraction, is included in the radiation path of the VECSEL 304 in order to impart the necessary information to the VECSEL laser beam before passing into the optical fiber 306. If the electro-optical element is included as an intra-cavity element with the VECSEL cavity, the element can also be used for rapid tuning/control of output wavelength, as is well understood by those skilled in the art. As is clear from FIG. 11, the VECSEL is lasing on a mode closest to gain maximum. When the temperature of the quantum well active region 324 is changed, the maximum of the gain shifts with a tuning of approximately 30 GHz/degree C. This, tuning range suggests that if the temperature of the gain structure is kept stable within 0.1 degree C., such thermal regulation will ensure that the VECSEL will be lasing on the selected mode. This approach avoids the drawbacks of absolute temperature control required for DFB lasers presently operating in the optical fiber telecommunications industry. As shown in FIG. 12, when the gain maximum is tuned to a position corresponding to the middle between two modes, the VECSEL will intermittently laser on one or the other mode. If the laser is switching between two modes, such switching can be detected with a monitor photodiode assembly, conventionally included within the optical transmitter 300 (but omitted from the FIG. 13 diagram avoid cluttering). By tuning the telecommunications VECSEL 304 over the entire frequency range, it is practical to detect all set points corresponding to gain positions exactly between the modes. These positions are then stored in a digital control unit (also present but not shown in the FIG. 13 diagram) enabling an exact match between temperature set points and the WDM channel to be computed and obtained via the thermoelectric cooling unit 312. This method enables compensation with temperature over time for material aging of the semiconductor structure materials of the VECSEL 304. The digital control unit also controls an adiabatic startup sequence at the pump laser 302 and regulates pump power during steady state operation, so that the VECSEL is started monomode and remains monomode during operation.

To further reduce the possibility of multimode lasing during startup, an optically-thin, intra-cavity element, such as an etalon or birefringent filter, can be added. The closest cavity mode to the transmission peak of this element becomes the chosen operational mode. As the WDM channel separation is $10^{-4}$ of the telecom channel frequency, positioning of the intra-cavity element=s optical peak has to be made with an accuracy of a few percent of the free spectral range, and this is readily reproducible with contemporary optical manufacturing techniques.

While the VECSEL 304 is preferred because of its relative simplicity of manufacture, other VECSEL arrangements and configurations are within the scope of the present invention. In FIG. 17, a VECSEL-based telecommunications transmitter 400 includes a laser diode pump 402, a pump beam focus lens 403, and a VECSEL 404. In this configuration, the pump energy enters one side of the VECSEL 404, and the laser energy exits another side of the VECSEL 404. A base 410, made of thermally conductive material such as copper, defines a pump aperture 411. A semiconductor structure, formed in reverse order in the same manner as the FIG. 14 VECSEL 304, has a pump-transparent dielectric mirror layer 414, an active gain region 416 and an antireflection coating 418. An external surface of the dielectric mirror layer 414 is polished very smooth and is bonded to a transparent substrate layer 412, such as diamond, by a suitable bonding method or agent. Vacuum bonding by VanDerWalls forces, or soldering with a pump-transparent material, such as indium, is preferred. Since the external lens 420 and spacer 422 are equivalent to the lens and spacer of the VECSEL 304, the explanations given above for those elements apply to the elements 420 and 422. With suitable modifications made clear by the foregoing explanations of structure and function of respective elements, the pump energy could enter the active region of VECSEL 404 via the external mirror 420, and the laser energy could exit via the aperture 411.

A further cost-saving improvement can be realised by use of a conventional laser diode pump at a power level of 150 mW, for example. It has been discovered that a polaritymatched beam of pump radiation is directed toward the active region of the VECSEL at Brewster's angle (approximately 70 degree relative to the laser beam axis), the pump efficiency matches a pump power level at one wall which is not directed to the VECSEL active region at Brewster's angle. The typical index of an edge-emitting low power diode laser is three to one. It is typically vertically polarized, and it is asymmetric and astigmatic. The typical index of the VECSEL at its pump receiving surface is three to one. If the elliptical pump beam is directed toward the active region of the VECSEL at Brewster's angle, the pump beam is perceived by the surface of the VECSEL semiconductor as being circular. If the polarities are correctly matched, then more of the pump beam is absorbed into the active region than if the pump energy arrives at an angle other than Brewster's angle.

In cases when single wavelength operation and discrete step-tuning is not necessary, such as spectroscopy, for example, the spacer, instead of being formed of low thermal expansion materials may be made of a material that changes its dimension under external stimulation, such as a piezoelectric transducer. FIG. 18 shows a MWQ VECSEL 500 in accordance with these principles. VECSEL 500 is similar in structure to VECSEL 304 shown in, and described in conjunction with, FIG. 13, so that common elements bear the same reference numerals and the previous descriptions of those elements apply to the FIG. 18 structure. However, in VECSEL 500 an annular piezoelectric element is sandwiched between the base 310, heatsink 312 and the spacer 315. In this case the VECSEL cavity length can be made even shorter, e.g. 1 mm or a few hundred microns, and the laser will provide single-frequency mode-hop tuning over several $cm^{-1}$.

Those skilled in the art will appreciate that many changes and modifications will become readily apparent from consideration of the foregoing descriptions of preferred embodiments without departure from the spirit of the present invention, the scope there of being more particularly point out by the following claims. The descriptions herein and the disclosures hereof are by way of illustration only and should not be construed as limiting the scope of the present invention.

What is claimed is:

1. A laser comprising:
   (1) the following layers in the following order;
      (a) a mirror;
      (b) an active region providing optical gain at a design wavelength $\lambda$ and, comprising at least one quantum well; and
      (c) an anti-reflection coating which together with the active region defines a sub-cavity having an optical length equal to an odd multiple of $\lambda/4$ so that the laser operates at antiresonance; and
   (2) a second mirror spaced apart from coating (c) to define an external cavity; the layers (1) being such that the free spectral range of the sub-cavity is less than 2 times the bandwidth of the coating (c); and the bandwidth of the mirror (a) is at least as great as the free spectral range of the sub-cavity;
   wherein the anti-reflection coating has an optical pathlength equal to 25 $\lambda/2$ or less and equal to a multiple of $\lambda/4$, and wherein the anti-reflection coating comprises the following layers in the following order in a direction away from active region (b):
      (i) a first layer having an optical pathlength of $\lambda/4$;
      (ii) at least one additional pair of layers, each layer of said pair having an optical pathlength of $\lambda/4$, the additional layers being of alternating higher and lower refractive index, the layer closest to layer (i) being one of the alternating layers of higher refractive index, which higher refractive index is greater than the refractive index of said first layer; and optionally
      (iii) a layer having an optical pathlength of $\lambda/2$ and having a refractive index greater than the refractive index of the adjacent layer.

2. A laser according to claim 1 wherein layer (iii) is present, wherein the active region (b) comprises gallium arsenide; wherein layer (i) comprises aluminum arsenide; wherein each layer of higher refractive index of pair or pairs (ii) comprises aluminum gallium arsenide; wherein the layer or layers of lower refractive index of said pair or pairs comprises aluminum arsenide; and wherein layer (iii) comprises aluminum gallium arsenide.

3. A laser according to claim 1 wherein the layer (iii) is absent; wherein the active region (b) is selected from the group consisting of indium gallium arsenide phosphide and aluminum gallium arsenide; wherein the layer (i) comprises indium phosphide; wherein each layer of higher refractive index of the pair or pairs (ii) comprises aluminum gallium indium arsenide; and wherein each layer of lower refractive of said pair or pairs comprises indium phosphide.

4. A laser comprising a resonator and a gain medium, wherein the resonator comprises a sub-cavity comprising:
   (a) a first region comprising a gallium arsenide layer having an optical gain at a design wavelength $\lambda$ of the laser and having an optical pathlength equal to 20 $\lambda/2$ or less;
   (b) an anti-reflection coating on the region (a), having an optical pathlength equal to 25 $\lambda/2$ or less and equal to a multiple of $\lambda/4$ so that the laser operates at antiresonance, and wherein the anti-reflection coating comprises the following layers in the following order in a direction away from region (a):
      (i) a layer comprising aluminum arsenide and having an optical pathlength of $\lambda/4$;
      (ii) at least one pair of layers each layer being of optical pathlength $\lambda/4$, the layers being of alternating higher and lower refractive indices, the layer closest to layer (i) being one of the alternating layers of higher refractive index; and
      (iii) a layer of optical pathlength $\lambda/2$ comprising aluminum gallium arsenide;
   wherein each layer of higher refractive index of pair or pairs (ii) comprises aluminum gallium arsenide; and wherein each layer of lower refractive index of said pair or pairs comprises aluminum arsenide.

5. A laser comprising a resonator and a gain medium, wherein the resonator comprises a sub-cavity comprising:
   (a) a first region comprising a layer having an optical gain at a design wavelength $\lambda$ of the laser and having an optical pathlength equal to 20 $\lambda/2$ or less;
   (b) an anti-reflection coating on the region (a), having an optical pathlength equal to 25 $\lambda/2$ or less and equal to a multiple of $\lambda/4$ so that the laser operates at antiresonance and wherein the anti-reflection coating comprises the following layers in the following order in a direction away from region (a):
      (i) a layer comprising indium arsenide and having an optical pathlength of $\lambda/4$; and (ii) at least one pair of layers, each layer being of optical pathlength $\lambda/4$, the layers being of alternating higher and lower refractive indices, the layer closest to layer (i) being one of the alternating layers of higher refractive index;

wherein the first region (a) is a member selected from the group consisting of indium gallium arsenide phosphide and aluminum gallium arsenide; wherein each layer of higher refractive index of pair or pairs (ii) comprises aluminum gallium indium arsenide; and wherein each layer of lower refractive index of said pair or pairs comprises indium phosphide.

* * * * *